(12) United States Patent
Jeon et al.

(10) Patent No.: US 11,469,325 B2
(45) Date of Patent: Oct. 11, 2022

(54) SEMICONDUCTOR DEVICES

(71) Applicant: SAMSUNG ELECTRONICS CO., LTD., Suwon-si (KR)

(72) Inventors: Young-Doo Jeon, Hwaseong-si (KR); Han-Wool Park, Hwaseong-si (KR); Se-Jin Park, Hwaseong-si (KR); No-Young Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 211 days.

(21) Appl. No.: 16/393,234

(22) Filed: Apr. 24, 2019

(65) Prior Publication Data
US 2020/0119181 A1 Apr. 16, 2020

(30) Foreign Application Priority Data
Oct. 10, 2018 (KR) .................. 10-2018-0120153

(51) Int. Cl.
| | |
|---|---|
| *H01L 29/76* | (2006.01) |
| *H01L 29/78* | (2006.01) |
| *H01L 21/762* | (2006.01) |
| *H01L 29/66* | (2006.01) |

(52) U.S. Cl.
CPC ...... *H01L 29/785* (2013.01); *H01L 21/76224* (2013.01); *H01L 29/66545* (2013.01); *H01L 29/66795* (2013.01)

(58) Field of Classification Search
CPC ............. H01L 29/785; H01L 21/76224; H01L 21/823431; H01L 27/0886; H01L 29/41791; H01L 29/66545; H01L 29/66795; H01L 21/76232; H01L 29/165; H01L 29/7846; H01L 29/7848
See application file for complete search history.

(56) References Cited

U.S. PATENT DOCUMENTS

| | | | |
|---|---|---|---|
| 8,881,066 B2 | 11/2014 | Shieh et al. | |
| 8,969,974 B2 | 3/2015 | Liaw | |
| 9,075,936 B2 | 7/2015 | Chen et al. | |
| 9,184,101 B2 | 11/2015 | Lo et al. | |
| 9,647,093 B2 | 5/2017 | Cheng et al. | |
| 9,911,606 B2 | 3/2018 | Chiang et al. | |
| 9,946,828 B2 | 4/2018 | Kim et al. | |
| 2016/0111524 A1* | 4/2016 | Ha | H01L 21/76229 438/283 |
| 2016/0233298 A1* | 8/2016 | Webb | H01L 27/0924 |
| 2018/0190654 A1 | 7/2018 | Wu et al. | |

* cited by examiner

*Primary Examiner* — Meiya Li
(74) *Attorney, Agent, or Firm* — Sughrue Mion, PLLC

(57) ABSTRACT

Provided in a semiconductor device including a substrate, an active region upwardly protruding from the substrate, a plurality of active fins upwardly protruding from the active region and extending in a first direction parallel to an upper surface of the substrate, the plurality of active fins being provided in a second direction that is parallel to the upper surface of the substrate and intersects with the first direction, and an isolation structure provided on the substrate, the isolation structure covering a sidewall of the active region and a lower portion of a sidewall of each of the plurality of active fins, wherein a first sidewall of the active region adjacent to a first active fin among the plurality of active fins has a staircase shape, the first active fin being provided on a first edge of the active region in the second direction.

20 Claims, 27 Drawing Sheets

FIG. 2
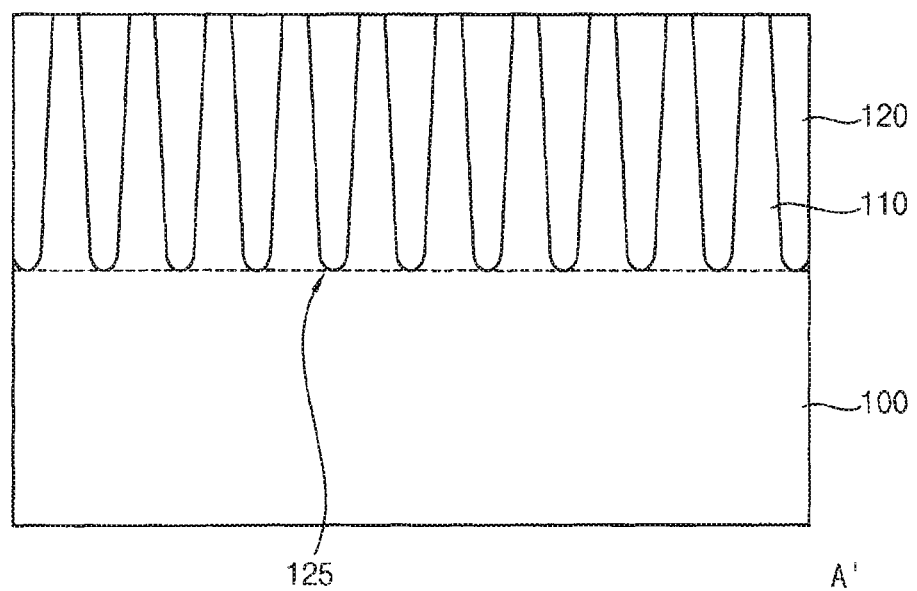
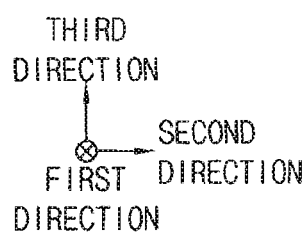

FIG. 24
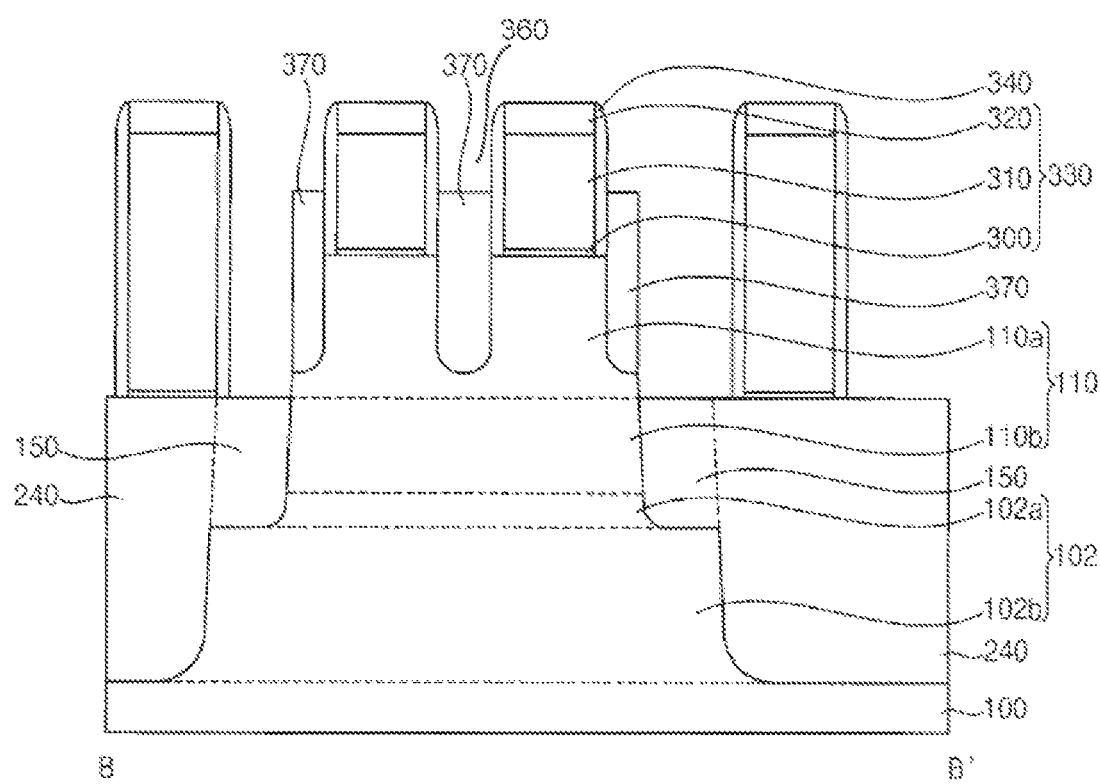
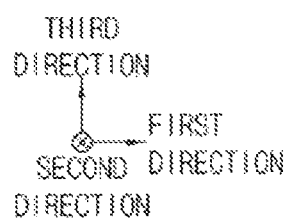

FIG. 26
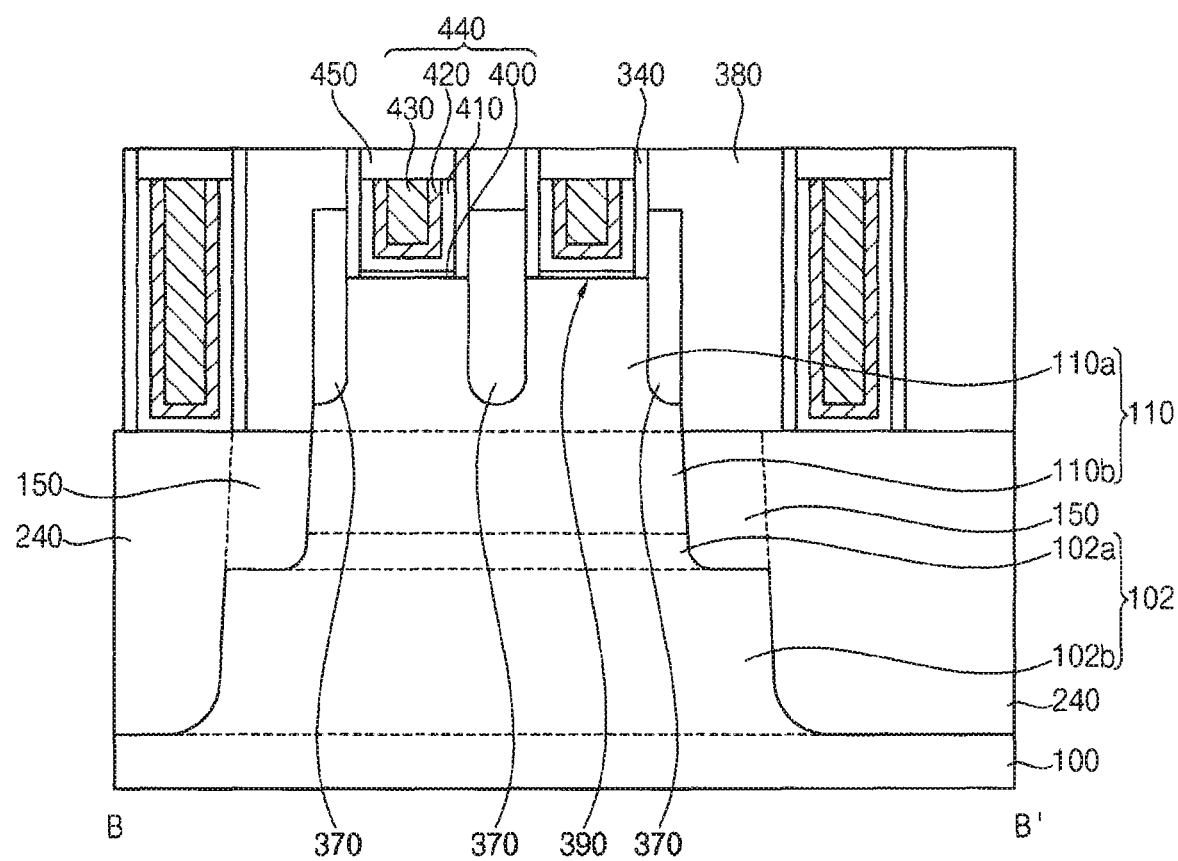
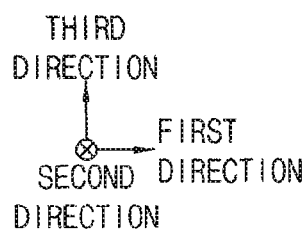

SEMICONDUCTOR DEVICES

CROSS-REFERENCE TO THE RELATED APPLICATION

This application claims priority under 35 USC § 119 to Korean Patent Application No. 10-2018-0120153, filed on Oct. 10, 2018 in the Korean Intellectual Property Office (KIPO), the contents of which are herein incorporated by reference in their entirety.

BACKGROUND

1. Field

Example embodiments relate to semiconductor devices. More particularly, example embodiments relate to semiconductor devices including fin field effect transistors (finFETs).

2. Description of the Related Art

When a finFET is formed, after performing a shallow trench isolation (STI) process to form active fins, an isolation layer is formed between the active fins, and a so-called deep trench isolation (DTI) process in which only some of the active fins in a desired region are left and other active fins in a remaining region are removed by an etching process using an etching mask may be performed. However, when the DTI process is performed to remove the isolation layer and the active fins, an etch profile may not be vertical, and thus a portion of neighboring active fins to be removed may remain to generate a ghost fin. An undesired source/drain layer may be formed on the ghost fin, and thus an electrical short may occur.

SUMMARY

Example embodiments provide semiconductor devices including finFETs having improved characteristics.

According to an aspect of an example embodiment, there is provided a semiconductor device including a substrate, an active region upwardly protruding from the substrate, a plurality of active fins upwardly protruding from the active region and extending in a first direction parallel to an upper surface of the substrate, the plurality of active fins being provided in a second direction that is parallel to the upper surface of the substrate and intersects with the first direction, and an isolation structure provided on the substrate, the isolation structure covering a sidewall of the active region and a lower portion of a sidewall of each of the plurality of active fins, wherein a first sidewall of the active region adjacent to a first active fin among the plurality of active fins has a staircase shape, the first active fin being provided on a first edge of the active region in the second direction.

According to another aspect of an example embodiment, there is provided a semiconductor device including a substrate, an active region upwardly protruding from the substrate, the active region including a lower portion having a first width in a second direction parallel to an upper surface of the substrate, and an upper portion provided on the lower portion, the upper portion having a second width smaller than the first width in the second direction, an active fin upwardly protruding from the active region and extending in a first direction, the first direction being parallel to the upper surface of the substrate and intersecting with the second direction, and an isolation structure provided on the substrate, the isolation structure covering a sidewall of the active region and a lower portions of a sidewall of the active fin.

According to another aspect of an example embodiment, there is provided a semiconductor device including a substrate, an active region upwardly protruding from the substrate, a plurality of active fins upwardly protruding from the active region and extending in a first direction parallel to an upper surface of the substrate, the active fins being provided in a second direction that is parallel to the upper surface of the substrate and intersects with the first direction, an isolation structure provided on the substrate, the isolation structure covering a sidewall of the active region and a lower portion of a sidewall of each of the plurality of active fins, a gate structure provided on the plurality of active fins and the isolation structure, respectively, the gate structure extending in the second direction, and a source/drain layer provided on the plurality of active fins adjacent to the gate structure, wherein a first sidewall of the active region adjacent to a first active fin among the plurality of active fins has a staircase shape, the first active fin being provided on a first edge of the active region in the second direction.

BRIEF DESCRIPTION OF THE DRAWINGS

The above and/or other aspects will become apparent and more readily appreciated from the following description of example embodiments, taken in conjunction with the accompanying drawings in which:

FIGS. 1 to 19 are plan views and cross-sectional views illustrating a method of manufacturing a semiconductor device in accordance with example embodiments;

FIGS. 23 to 28 are cross-sectional views illustrating a method of manufacturing a semiconductor device in accordance with example embodiments.

DESCRIPTION OF THE EXAMPLE EMBODIMENTS

A semiconductor device in accordance with example embodiments will be described more fully hereinafter with reference to the accompanying drawings.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Hereinafter, two directions substantially parallel to an upper surface of a substrate and intersecting with each other are defined as first and second directions, respectively, and a vertical direction substantially perpendicular to the upper surface of the substrate is defined as a third direction. In example embodiments, the first and second directions may be substantially orthogonal to each other.

FIGS. 1 to 19 are plan views and cross-sectional views illustrating a method of manufacturing a semiconductor device in accordance with example embodiments. Specifically, FIGS. 1, 3, 6, 8, 11 and 15 are plan views, and FIGS. 2, 4-5, 7, 9-10, 12-14 and 16-19 are cross-sectional views.

Figure 17:
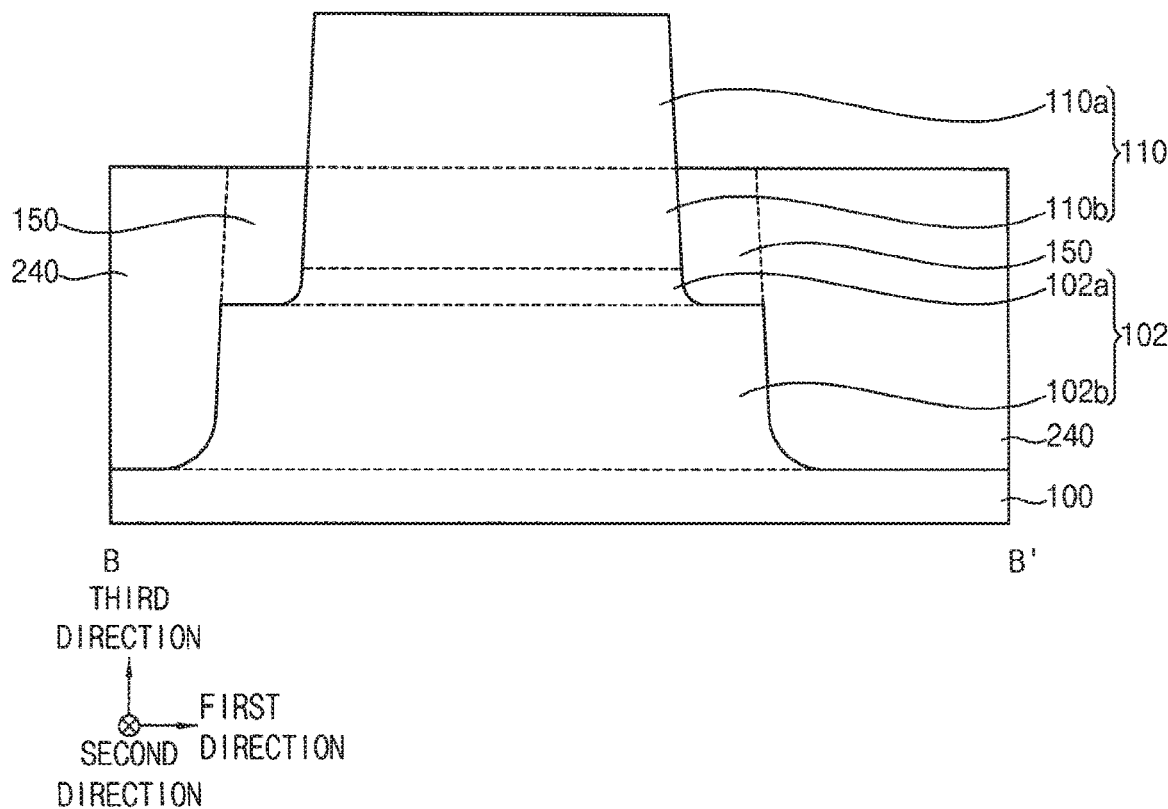
Figure 18:
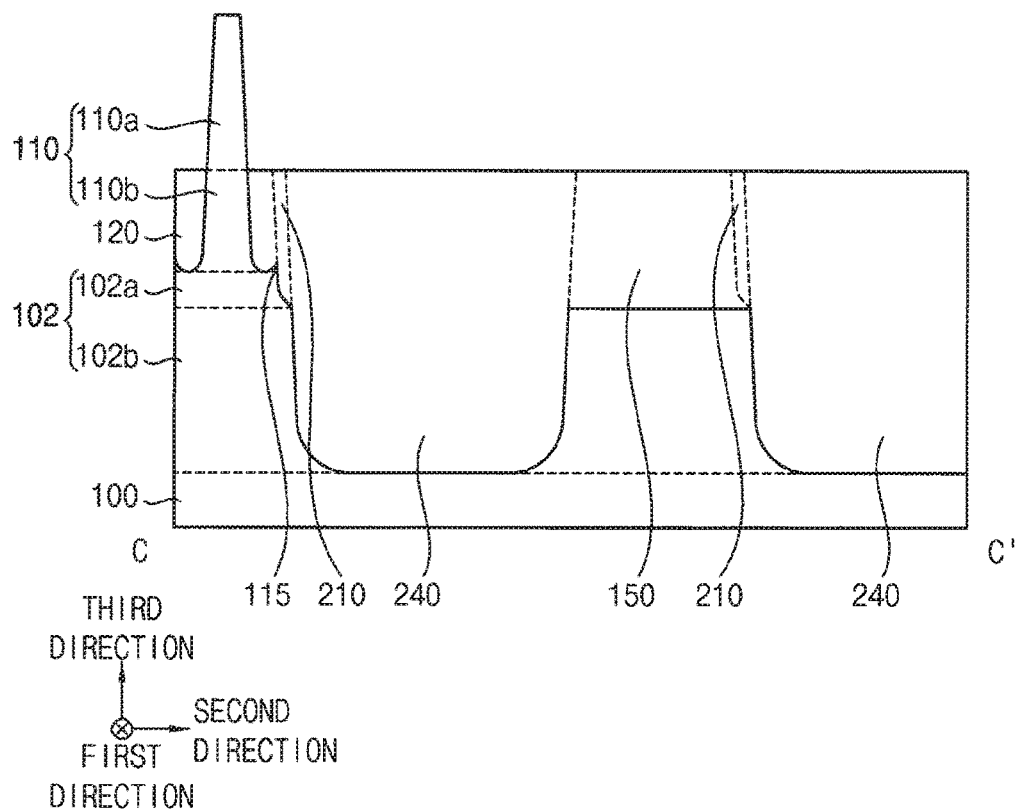
Figure 19:
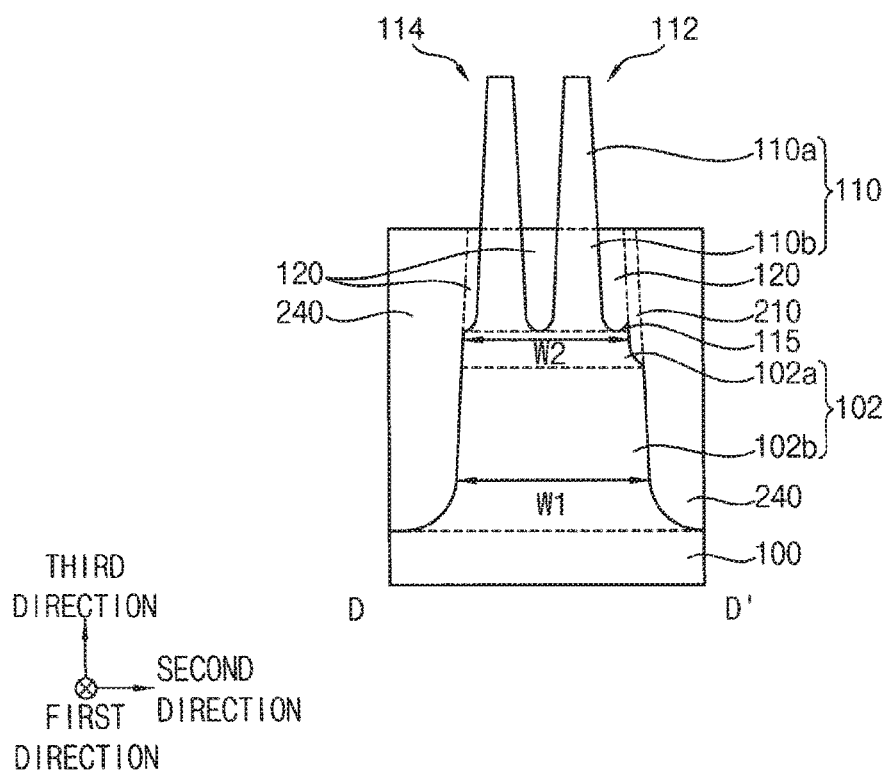

FIGS. 2, 4, 9, 12 and 16 are cross-sectional views taken along lines A-A' of corresponding plan views in FIGS. 1, 3, 8, 11, and 15, respectively. FIGS. 5, 13 and 17 are cross-sectional views taken along lines B-B' of corresponding plan views in FIGS. 3, 11, and 15, respectively. FIGS. 7, 10, 14 and 18 are cross-sectional views taken along lines C-C' of corresponding plan views in FIGS. 6, 8, 11, and 15, respectively. FIG. 19 is a cross-sectional view taken along a line D-D' of a corresponding plan view in FIG. 15.

Figure 1:
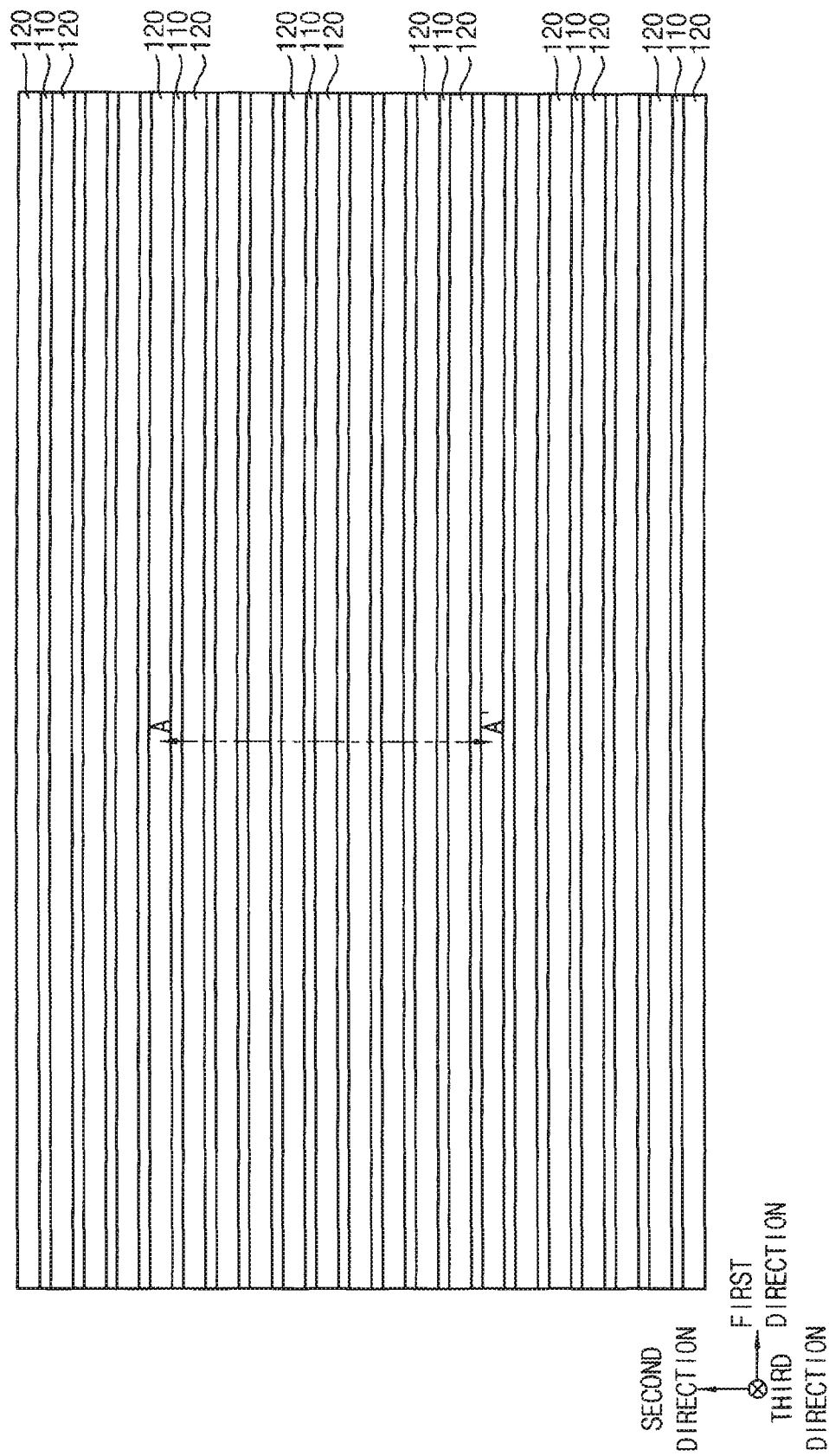

Referring to FIGS. 1 and 2, an upper portion of a substrate 100 may be etched by a first etching process using a first etching mask to form active fins 110.

The substrate 100 may include semiconductor materials, e.g., silicon, germanium, silicon-germanium, etc., or III-V compounds e.g., gallium phosphide (GaP), gallium arsenide (GaAs), gallium antimonide (GaSb), etc. In example embodiments, the substrate 100 may be a silicon-on-insulator (SOI) substrate or a germanium-on-insulator (GOI) substrate.

Hereinafter, a lower portion of the substrate 100, that is, a portion of the substrate 100 having a height lower than lower surfaces of the active fins 110 may be referred to as the substrate 100, which may be distinguished from the active fins 110.

In example embodiments, each of the active fins 110 may extend in the first direction, and a plurality of active fins 110 may be formed to be spaced apart from each other at a regular interval along the second direction that is perpendicular to the first direction as illustrated in FIG. 1.

Due to the characteristics of the general etching process, each of the active fins 110 formed by the first etching process may not have a sidewall vertical to the upper surface of the substrate 100 in the third direction that is perpendicular to the first direction and the second direction, respectively, and may be formed to have an angle, for example, greater than 80 degrees and less than 90 degrees with respect to the upper surface of the substrate 100. Accordingly, each of the active fins 110 may have a width gradually increasing from an upper portion toward a lower portion thereof toward the upper surface of the substrate 100, and a first recess 125 between the active fins 110 may have a width gradually decreasing from an upper portion toward a lower portion thereof.

After forming a first isolation layer on the substrate 100 to cover the active fins 110, the first isolation layer may be planarized until upper surfaces of the active fins 110 may be exposed, so that a first isolation pattern 120 may be formed to fill the first recess 125.

The first isolation pattern 120 may include an oxide, e.g., silicon oxide. The planarization process may include, e.g., a chemical mechanical polishing (CMP) process and/or an etch back process.

Figure 3:
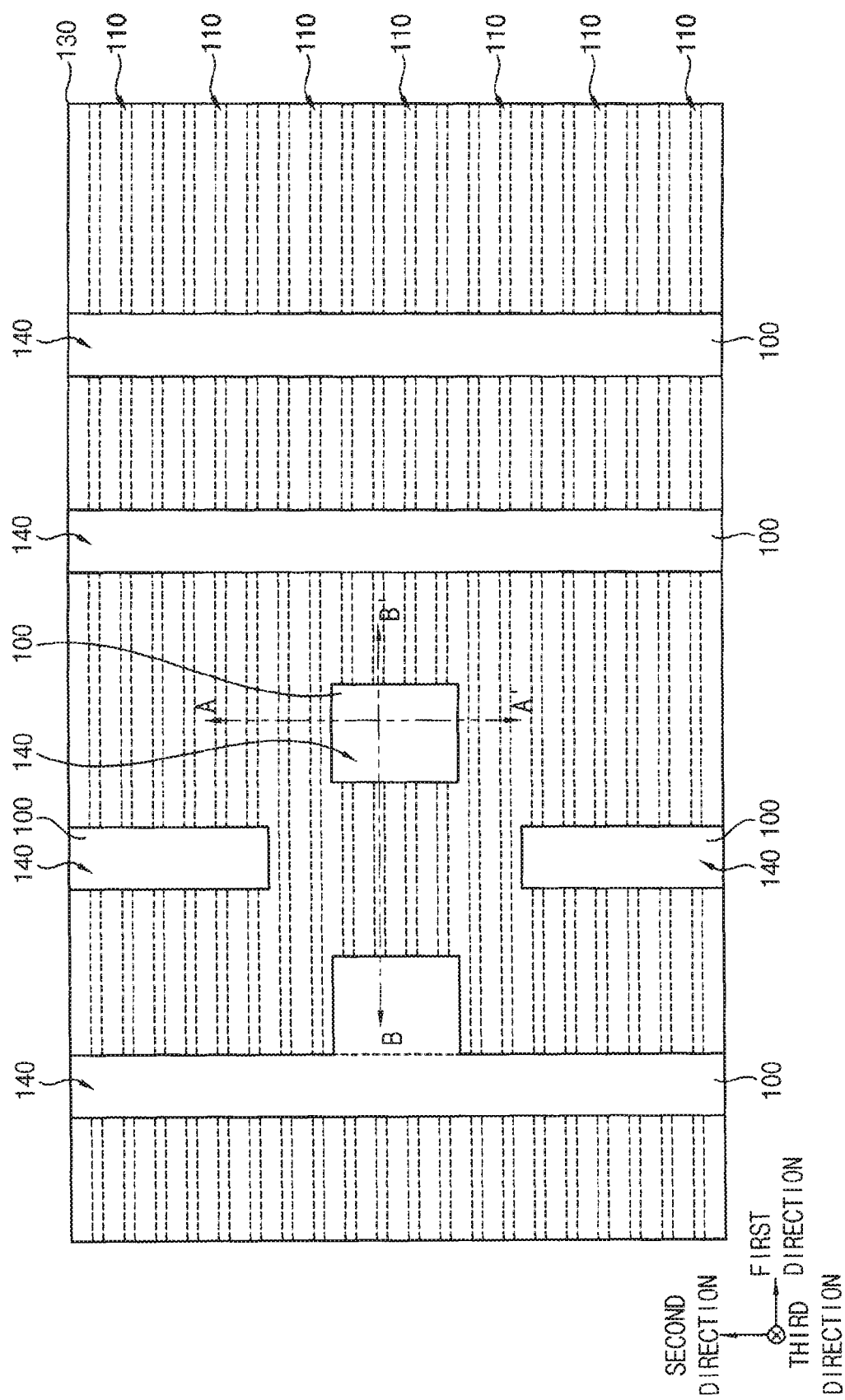
Figure 4:
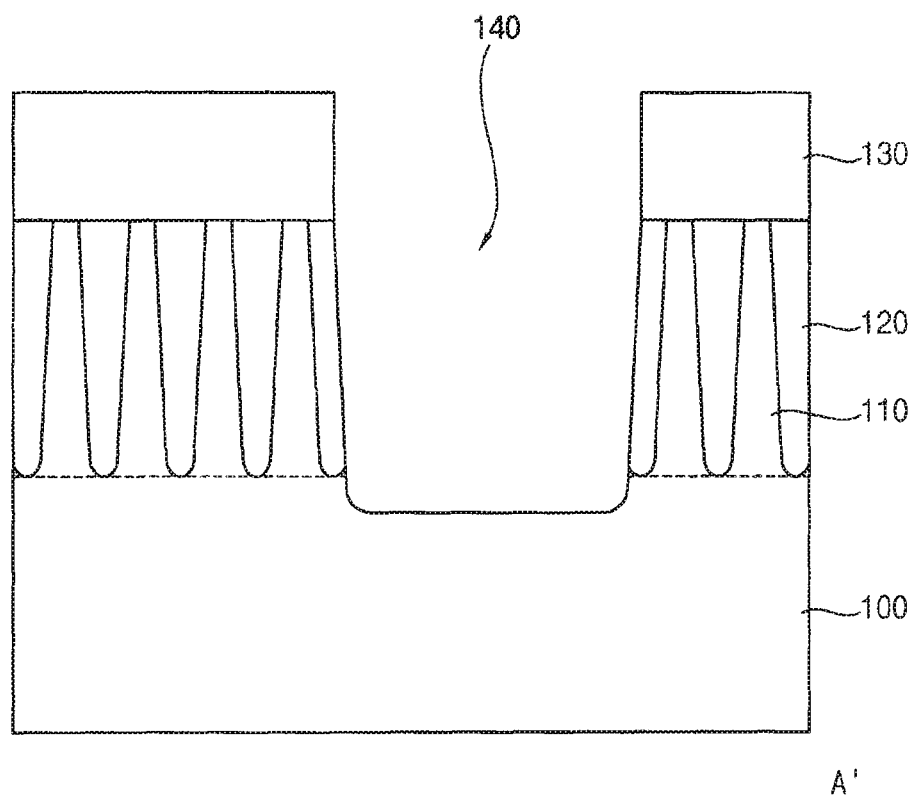
Figure 5:
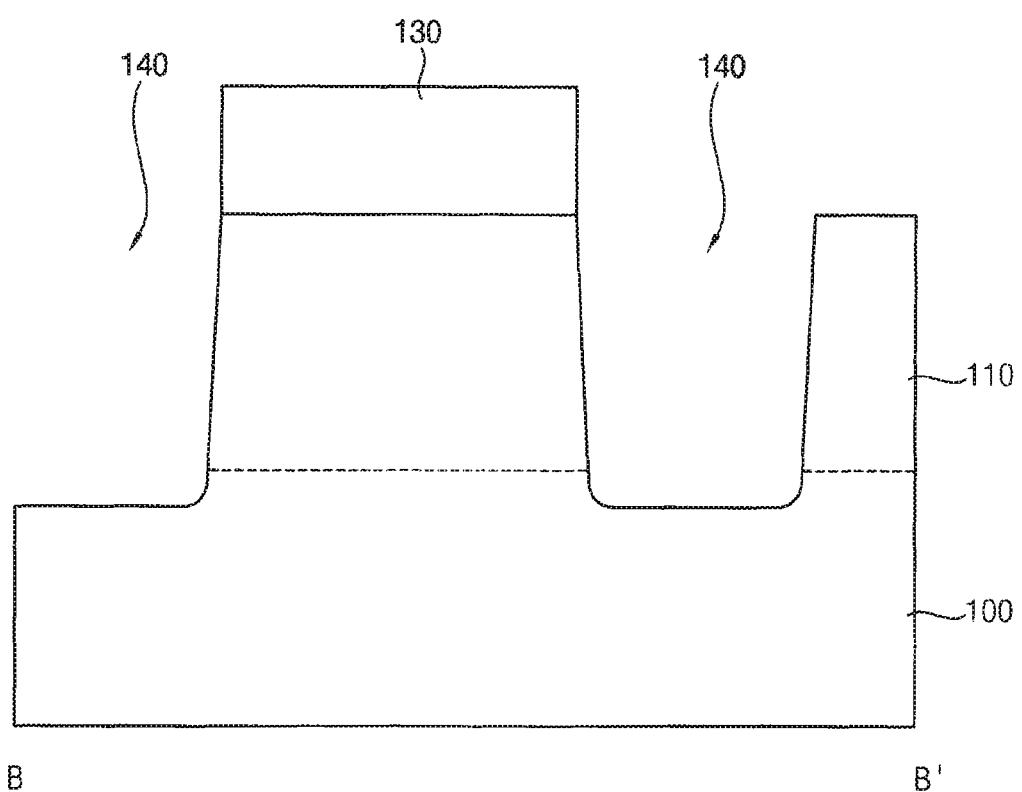

Referring to FIGS. 3 to 5, after forming a second etching mask 130 on the active fins 110 and the first isolation pattern 120, some of the active fins 110 and portions of the first isolation pattern 120 adjacent thereto may be partially removed by a second etching process using the second etching mask 130, and thus, a first opening 140 may be formed to expose the upper surface of the substrate 100.

In example embodiments, a plurality of first openings 140 may be formed, spaced apart from each other, along the first direction and may extend at different given lengths along the second direction. In some regions, the first opening 140 extending in the second direction may be connected to each other.

Also, when a distance between the first openings 140 is very small, it may be difficult to form all of the first openings 140 using one second etching mask 130. Accordingly, some of the first openings 140 may be formed by the second etching process using the second etching mask 130, and remaining first openings 140 may be formed by additionally performing a third etching process using a third etching mask.

In example embodiments, the first opening 140 formed by the second etching process may expose the upper surface of the substrate 100, and the upper portion of the substrate 100 may be partially removed in the second etching process so that a lower surface of the first opening 140 may be lower than the upper surface of the substrate 100 in the third direction as illustrated in FIG. 4. Accordingly, the lower surface of the first opening 140 may be lower than the lower surfaces of the active fins 110 in the third direction.

The second etching process may be performed on the upper surface of the substrate 100 at an angle, for example, greater than 80 degrees and less than 90 degrees along the third direction.

Figure 6:
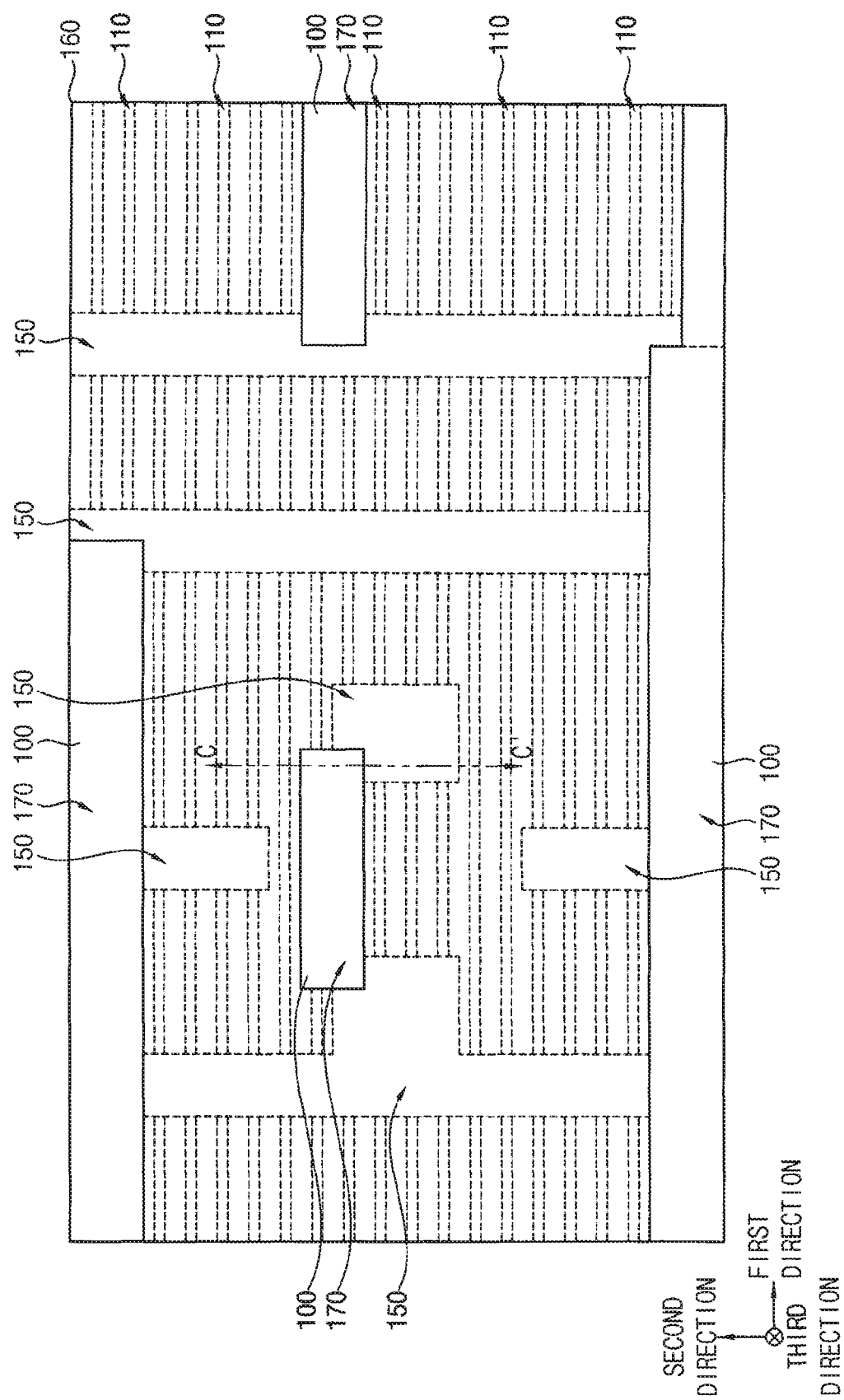
Figure 7:
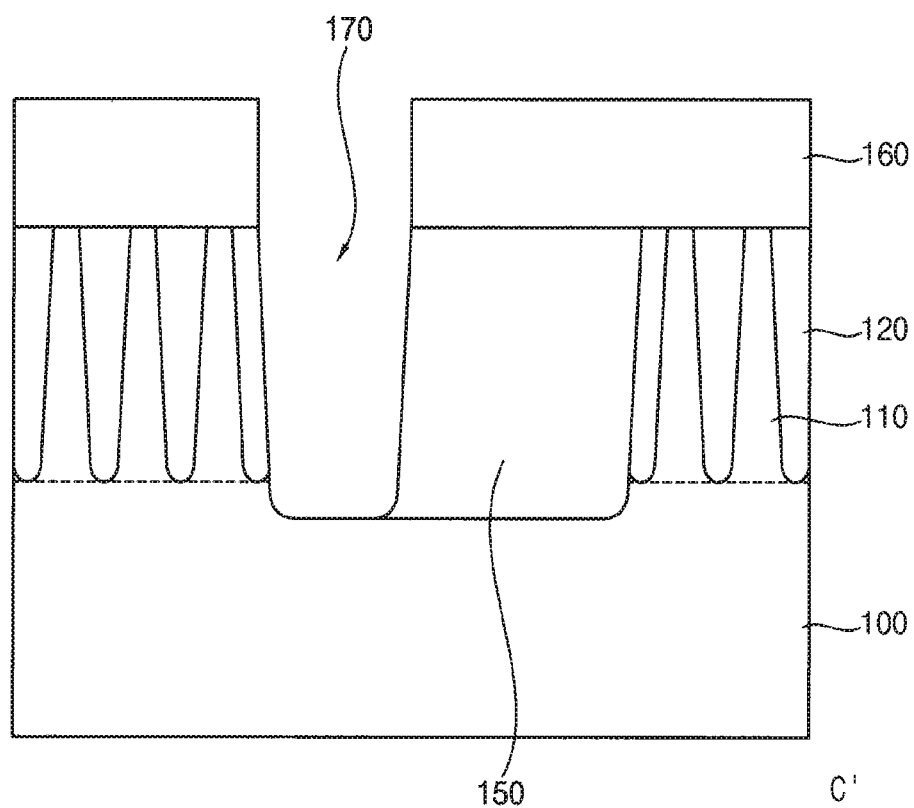

Referring to FIGS. 6 and 7, the second etching mask 130 may be removed, and a second isolation pattern 150 may be formed to fill the first opening 140.

The second isolation pattern 150 may be formed by forming a second isolation layer on the substrate 100, the active fins 110, and the first isolation pattern 120 to fill the first opening 140, and planarizing the second isolation layer until the upper surfaces of the active fins 110 may be exposed. The second isolation pattern 150 may include an oxide, e.g., silicon oxide. In example embodiments, the second isolation pattern 150 may include a material substantially the same as that of the first isolation pattern 120, and thus may be merged with the first isolation pattern 120. However, example embodiments are not limited thereto.

A fourth etching mask 160 may be formed on the active fins 110 and the first isolation pattern 120 and the second isolation pattern 150. Portions of the active fins 110 and portions of the first and second isolation patterns 120 and 150 adjacent thereto may be partially removed by a fourth etching process using the fourth etching mask 160, and thus a second opening 170 may be formed to expose the upper surface of the substrate 100.

In example embodiments, a plurality of second openings 170 may be formed, spaced apart, along the second direction and may extend at different given lengths along the first direction. In some regions, the second openings 170 extending in the first direction may be connected to each other.

In example embodiments, the second opening 170 formed by the fourth etching process may expose the upper surface of the substrate 100, and the upper portion of the substrate 100 may be partially removed in the fourth etching process so that a lower surface of the second opening 170 may be lower than the upper surface of the substrate 100 in the third direction as illustrated in FIG. 7. Accordingly, the lower surface of the second opening 170 may be lower than the lower surfaces of the active fins 110 in the third direction. In an example embodiment, the lower surface of the second opening 170 may be formed at a height substantially the same as that of the lower surface of the first opening 140. However, example embodiments are not limited thereto, and the height of the lower surface of the second opening 170 may be different from the height of the lower surface of the first opening 140.

The fourth etching process may be performed on the upper surface of the substrate 100 at an angle, for example, greater than 80 degrees and less than 90 degrees along the third direction.

Figure 8:
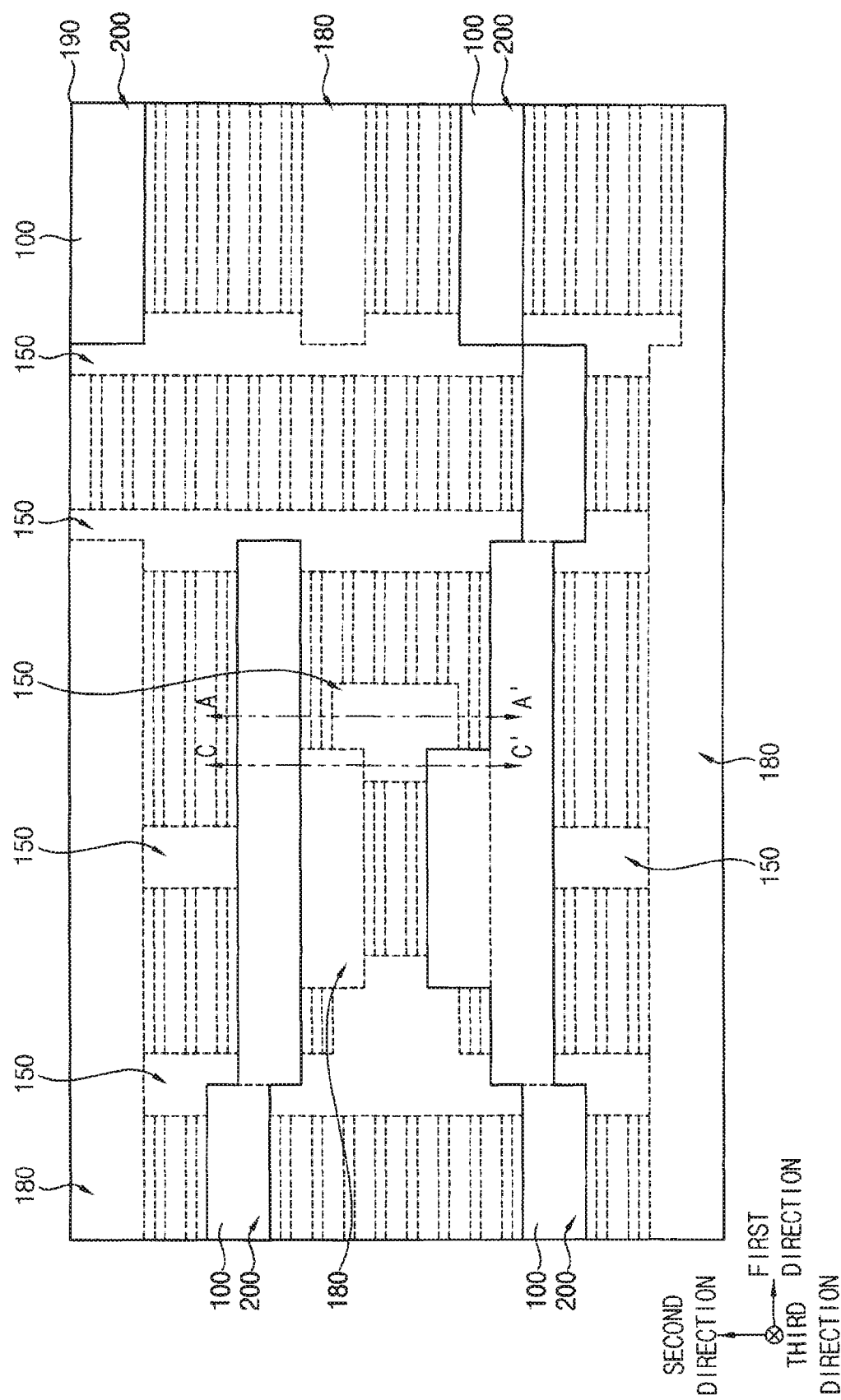
Figure 9:
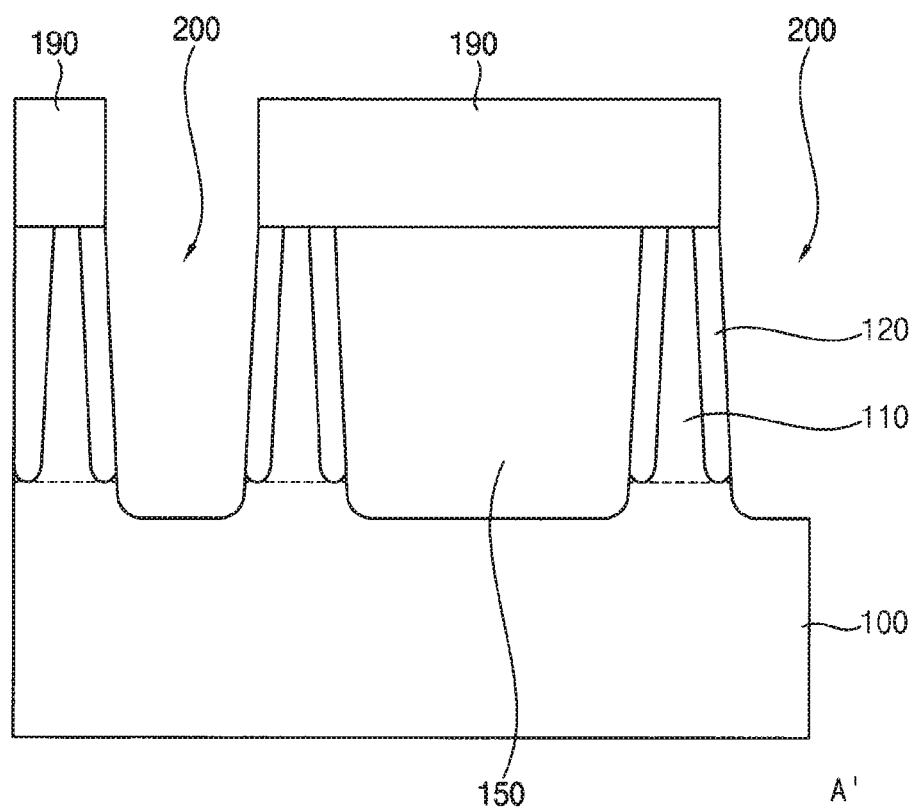
Figure 10:
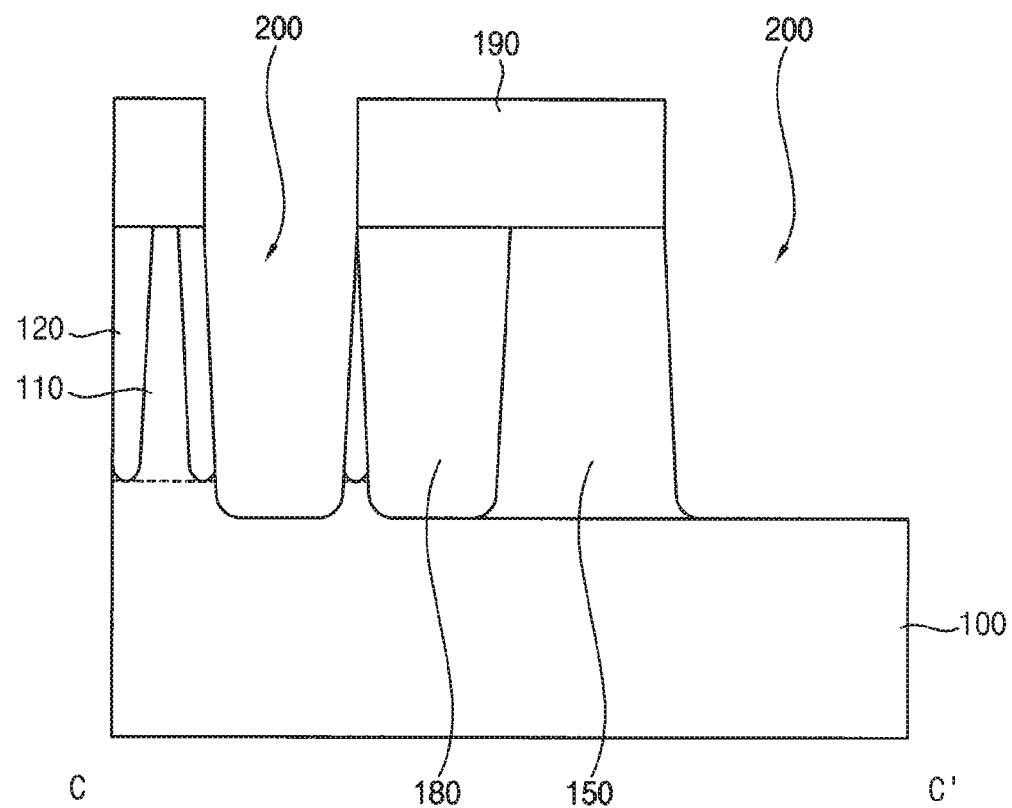
Figure 11:
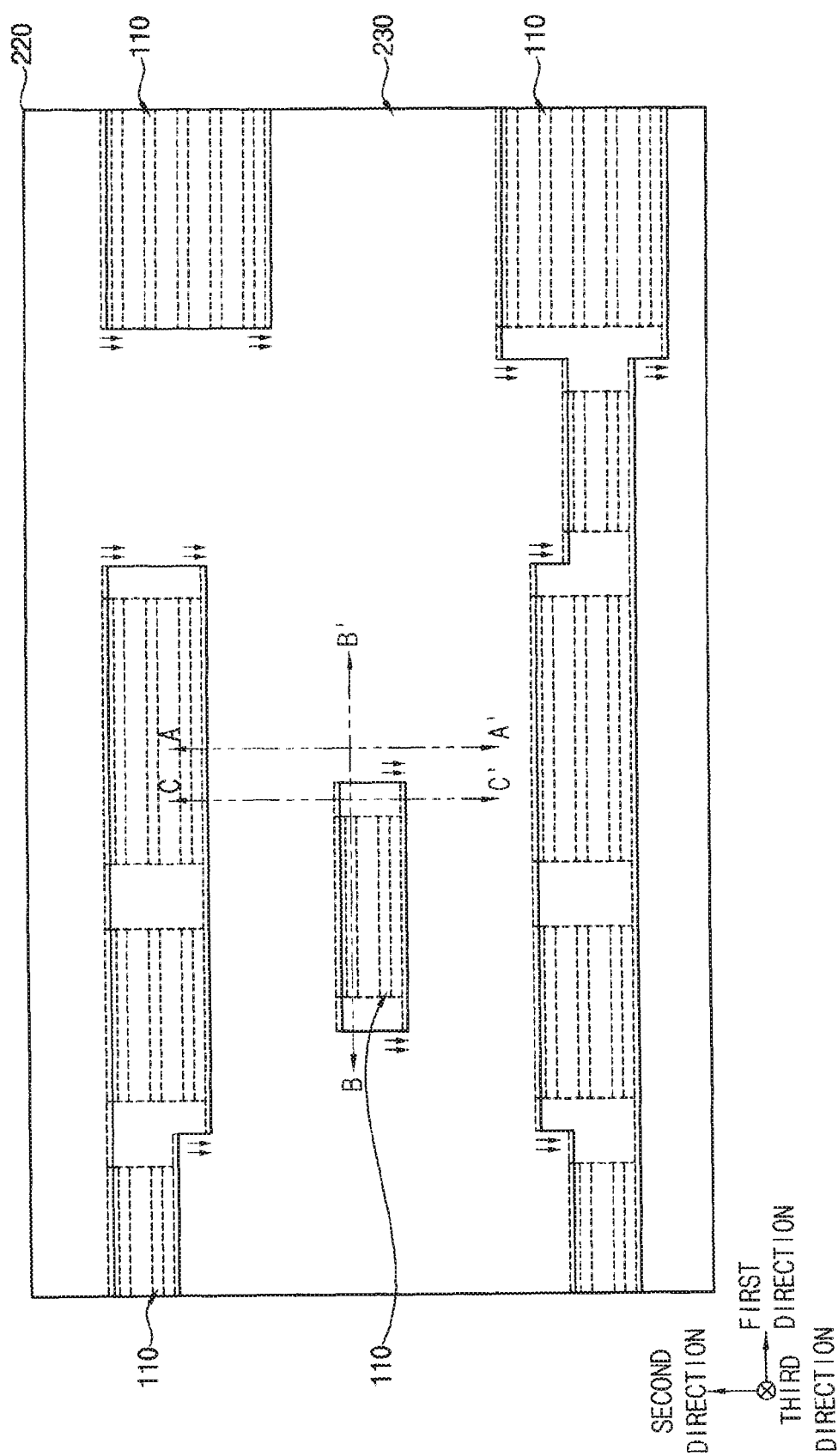

Referring to FIGS. 8 to 10, the fourth etching mask 160 may be removed, and a third isolation pattern 180 may be formed to fill the second opening 170.

The third isolation pattern 180 may be formed by forming a third isolation layer on the substrate 100, the active fins 110, and the first and second isolation patterns 120 and 150 to fill the second opening 170, and planarizing the third isolation layer until the upper surfaces of the active fins 110 may be exposed. The third isolation pattern 180 may include an oxide, e.g., silicon oxide. In example embodiments, the third isolation pattern 180 may include a material substantially the same as that of the first and second isolation patterns 120 and 150, and thus may be merged with the first and second isolation patterns 120 and 150. However, example embodiments are not limited thereto.

A fifth etching mask 190 may be formed on the active fins 110 and the first to third isolation patterns 120, 150 and 180. Some of the active fins 110 and portions of the first to third isolation patterns 120, 150 and 180 adjacent thereto may be partially removed by a fifth etching process using the fifth etching mask 190, and thus a third opening 200 may be formed to expose the upper surface of the substrate 100.

In example embodiments, a plurality of third openings 200 may be formed, spaced apart, along the second direction and may extend at different given lengths along the first direction. In some regions, the third openings 200 extending in the first direction may be connected to each other.

In example embodiments, some of the third openings 200 may be formed at a distance very close to some of the second openings 170 formed by the fourth etching mask 160. When a distance between the second openings 170 is very small, it may be difficult to form all of the second openings 170 using only one fourth etching mask 160. Accordingly, in addition to some of the second openings 170 formed by the fourth etching process, the fifth etching process described in FIGS. 8 to 10 may form the remaining second openings 170 to be formed to extend in the first direction.

In example embodiments, the third opening 200 formed by the fifth etching process may expose the upper surface of the substrate 100, and further, the upper portion of the substrate 100 may be partially removed in the fifth etching process so that a lower surface of the third opening 200 may be lower than the upper surface of the substrate 100 in the third direction as illustrated in FIG. 9. Accordingly, the lower surface of the third opening 200 may be lower than the lower surfaces of the active fins 110 in the third direction. In an example embodiment, the lower surface of the third opening 200 may be formed at a height substantially the same as that of the lower surfaces of the first and second openings 140 and 170. However, example embodiments are not limited thereto, and the height of the lower surface of the third opening 200 may be different from the heights of the lower surfaces of the first and second openings 140 and 170.

The fifth etching process may be performed on the upper surface of the substrate 100 at an angle, for example, greater than 80 degrees and less than 90 degrees along the third direction.

Referring to FIGS. 11 to 14, the fifth etching mask 190 may be removed, and a fourth isolation pattern 210 may be formed to fill the third opening 200.

The fourth isolation pattern 210 may be formed by forming a fourth isolation layer on the substrate 100, the active fins 110, and the first to third isolation patterns 120, 150 and 180 to fill the third opening 200, and planarizing the fourth isolation layer until the upper surfaces of the active fins 110 may be exposed. The fourth isolation pattern 210 may include an oxide, e.g., silicon oxide. In example embodiments, the fourth isolation pattern 210 may include a material substantially the same as that of the first to third isolation patterns 120, 150 and 180, and thus may be merged with the first to third isolation patterns 120, 150 and 180. However, example embodiments are not limited thereto.

A sixth etching mask 220 may be formed on the active fins 110, and the first to fourth isolation patterns 120, 150, 180 and 210, some of the active fins 110 and portions of the first to fourth isolation patterns 120, 150, 180 and 210 adjacent thereto. The upper portion of the substrate 100 may be partially removed by a sixth etching process using the sixth etching mask 220, and thus a second recess 230 may be formed on the upper surface of the substrate 100.

Figure 12:
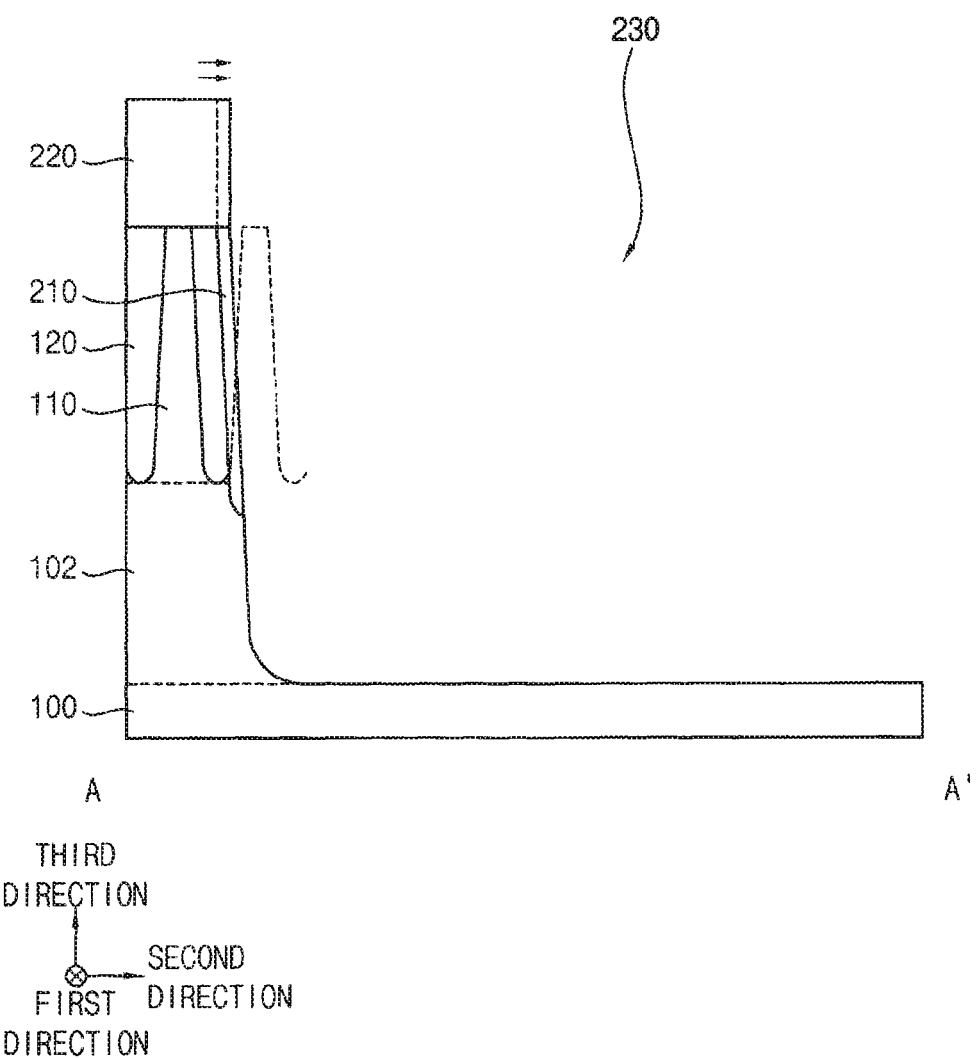
Figure 13:
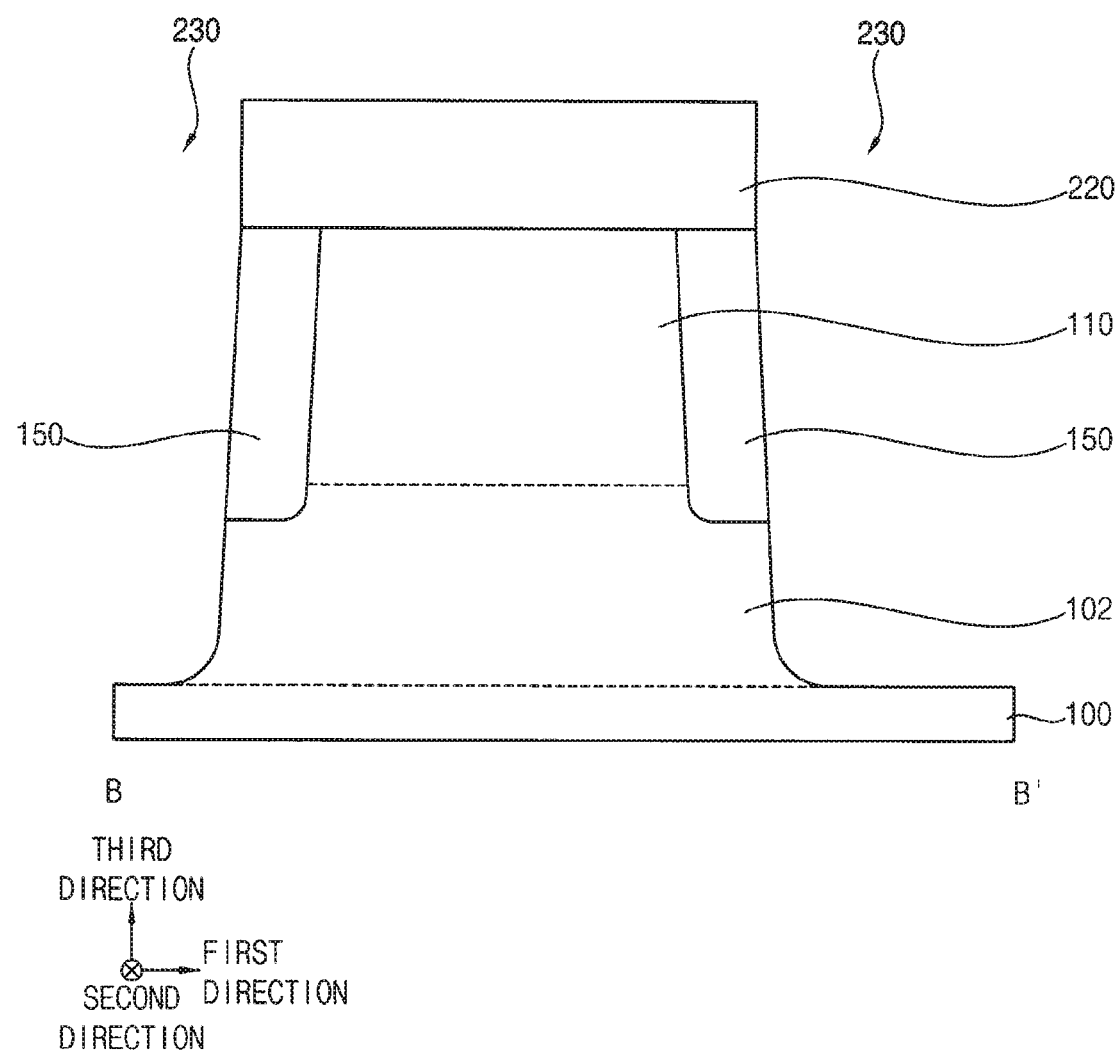
Figure 14:
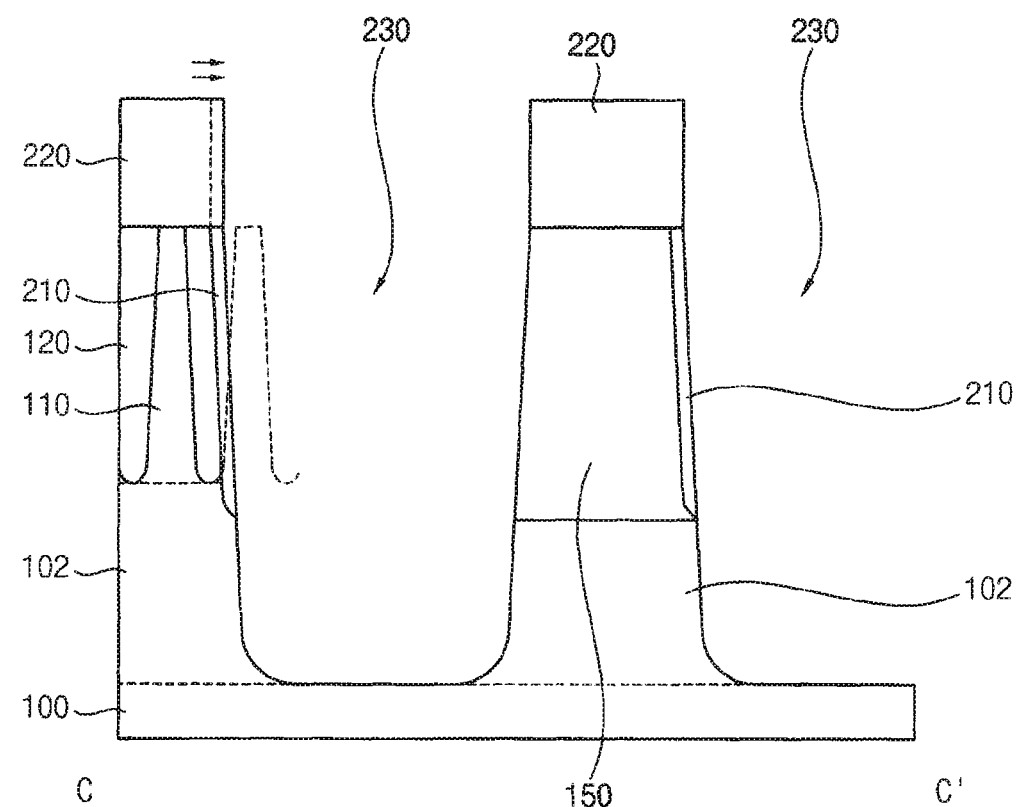
Figure 15:
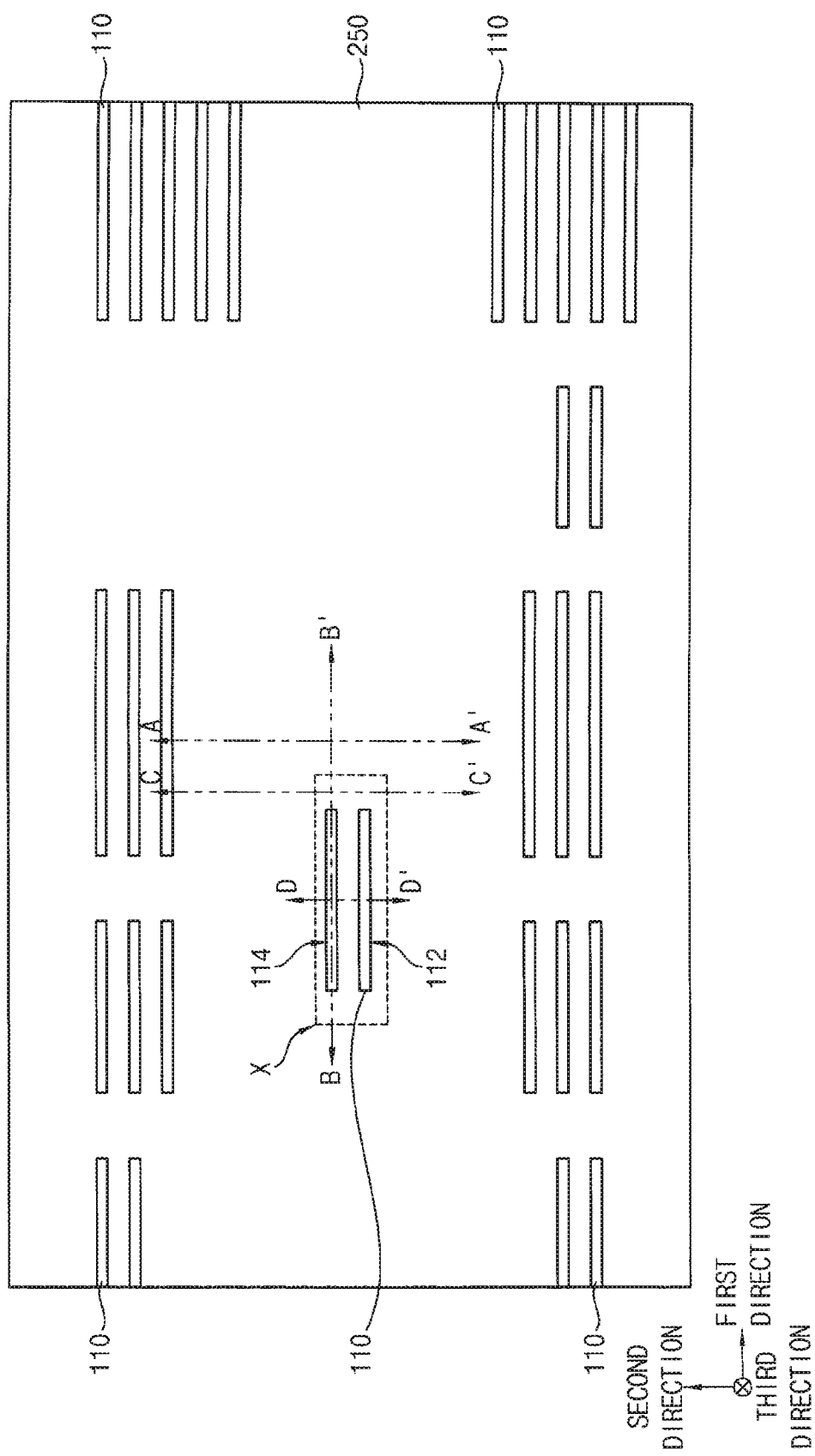
Figure 16:
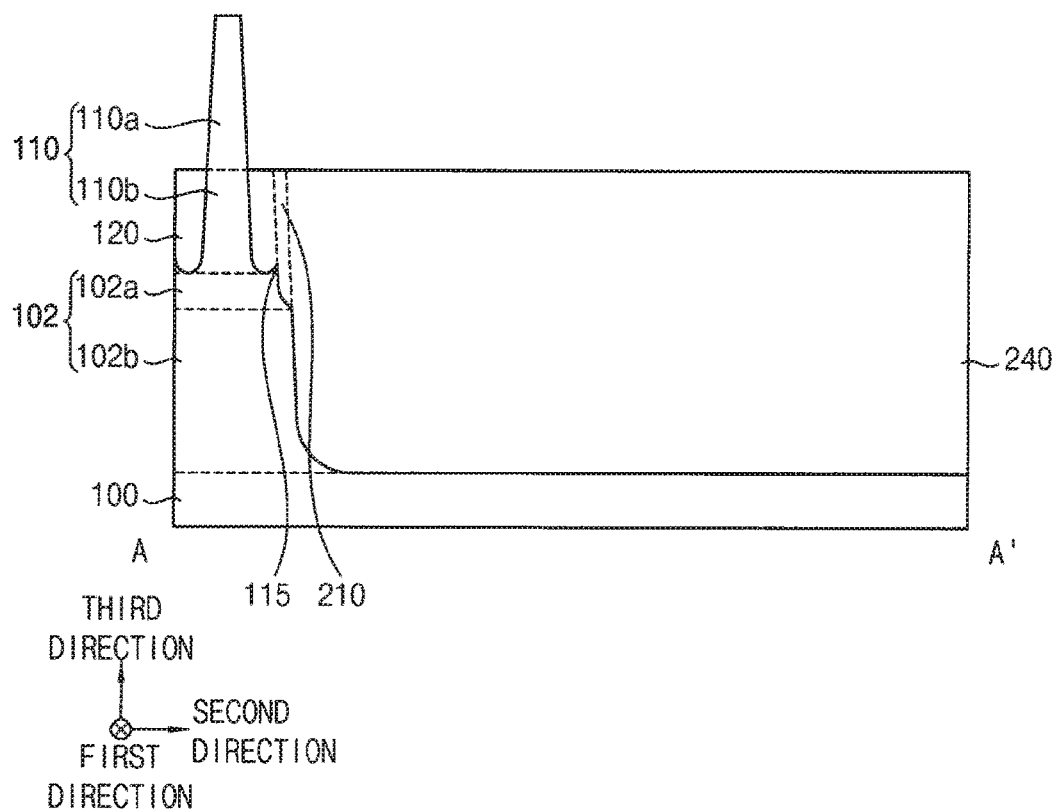

In example embodiments, a lower surface of the second recess 230 formed by the sixth etching process may be lower than the lower surfaces of the active fins 110, and lower than the lower surfaces of the first to fourth isolation patterns 120, 150, 180 and 210 in the third direction as illustrated in FIG. 12. Accordingly, an active region 102 defined by the second recess 230 may be formed on the substrate 100. Hereinafter, a lower portion of the substrate 100, that is, a portion of the substrate 100 having a height lower than a lower surface of the active region 102 may be referred to as the substrate 100, which may be separate from the active region 102. As a result, the active region 102 may be formed on the substrate 100, and the active fins 110 may be formed on the active region 102.

The sixth etching process may be performed on the upper surface of the substrate 100 at an angle, for example, greater than 80 degrees and less than 90 degrees along the third direction.

A misalignment may occur during the process for forming the sixth etching mask 220 used in the sixth etching process, and thus, for example, the second recess 230 may be formed at an area shifted from a desired position by a given length in the second direction. Accordingly, as described in FIGS. 12 and 14, for example, a portion of the fourth isolation pattern 210, which covers a first sidewall of a first active fin 110 on a first edge in the second direction among the active fins 110 on the active region 102, may not be entirely removed during the process for forming the second recess 230.

If the process described in FIGS. 8 to 10, that is, the fifth etching process using the fifth etching mask 190 has not been performed, the second recess 230 may be formed at the area shifted from the desired position in the second direction, and thus a second active fin 110 adjacent to the first active fin 110 in the second direction may not be entirely removed and partially remain. However, in example embodiments, the fifth etching process has been performed to entirely remove the second active fin 110, and thus, even when a misalignment occurs during the process for forming the sixth etching mask 220, all of the desired active fins 110 including the second active fin 110 may be removed. This will be described in more detail with reference to FIGS. 20 to 22.

Referring to FIGS. 15 to 19, the sixth etching mask 220 may be removed, and a fifth isolation pattern 240 may be formed to fill the second recess 230.

The fifth isolation pattern 240 may be formed by forming a fifth isolation layer on the substrate 100, the active fins 110, and the first to fourth isolation patterns 120, 150, 180 and 210 to fill the second recess 230, and planarizing the fifth isolation layer until the upper surfaces of the active fins 110 may be exposed. The fifth isolation pattern 240 may include an oxide, e.g., silicon oxide. In example embodiments, the fifth isolation pattern 240 may include a material substantially the same as that of the first to fourth isolation patterns 120, 150, 180 and 210, and thus may be merged with the first to fourth isolation patterns 120, 150, 180 and 210. However, example embodiments are not limited thereto.

Hereinafter, the first to fifth isolation patterns 120, 150, 180, 210 and 240 altogether may be referred to as an isolation structure 250.

An upper portion of the isolation structure 250 may be removed to expose upper portions of the active fins 110. Accordingly, each of the active fins 110 may include a lower active pattern 110b of which a sidewall may be covered by the isolation structure 250 and an upper active pattern 110a upwardly protruding from the isolation structure 250 in the third direction.

By the processes described above, the semiconductor device including the active fins 110, the active region 102, and the isolation structure 250 at least partially covering sidewalls thereof may be formed on the substrate 100.

As described above, before performing the sixth etching process to define the active region 102 by forming the second recess 230 on the substrate 100, the fourth and fifth etching processes using the fourth and fifth etching masks 160 and 190 may be performed. The second and third openings 170 and 200 formed by the fourth and fifth etching processes may be formed on both sides of the active region 102 to be finally implemented in the second direction, and thus by the fourth and fifth etching processes, the active fins 110 on both sides of the active region 102 in the second direction may be removed. Accordingly, even when a misalignment occurs during the process for forming the sixth etching mask used in the sixth etching process performed to form the active region 102, the active fins 110 may not remain on an outside of the active region 102.

The semiconductor device may, for example, have a region X including the active region 102 on which two active fins 110 are formed is described as follows. In this case, the two active fins 110 are referred to as first and second active fins 112 and 114, respectively.

Referring to FIG. 19, the active region 102 upwardly protruding from the substrate 100 may include a lower portion 102b having a first width W1 in the second direction substantially parallel to the upper surface of the substrate 100, and an upper portion 102a being formed on the lower portion 102b having a second width W2 smaller than the first width W1 in the second direction. That is, among both sidewalls of the active region 102 in the second direction, a first sidewall of the active region 102 adjacent to the first active fin 112 may be bent or curved at a boundary between the lower portion 102b and the upper portion 102a, and as the first sidewall may have a staircase shape as a whole, the upper portion 102a may have a width smaller than that of the lower portion 102b.

Accordingly, a distance from an upper portion of the first sidewall of the active region 102, that is, a sidewall of the upper portion 102a of the active region 102 to the first active fin 112 along the second direction may be smaller than a distance from a lower portion of the first sidewall of the active region 102, that is, a sidewall of the lower portion 102b of the active region 102 to the first active fin 112 along the second direction.

A second sidewall opposite to the first sidewall of the active region 102 may not be bent or curved, but may be flat along the third direction, and thus may have a constant slope with respect to the upper surface of the substrate 100.

Each of the first and second active fins 112 and 114 may upwardly protrude from the active region 102 and extend in the first direction, and the sidewall of the active region 102 and lower sidewalls of the first and second active fins 112 and 114 may be covered by the isolation structure 250 on the substrate 100.

In example embodiments, a first protrusion 115, which may be a residue of the active fins 110 removed by the fifth etching process using the fifth etching mask 190, may be formed between the first active fin 112 and the first sidewall of the active region 102. A height of an upper surface of the first protrusion 115 may be lower than a height of an upper surface of the isolation structure 250, and thus a source/drain layer 370 may not be formed on the first protrusion 115 by a selective epitaxial growth (SEG) process that will be described with reference to FIGS. 24 and 25.

A sidewall of the second active fin 114 may directly contact the second sidewall of the active region 102, and the first protrusion 115 may not be formed therebetween.

As described above, the isolation structure 250 may include the first to fifth isolation patterns 120, 150, 180, 210 and 240. All of the first to fifth isolation patterns 120, 150, 180, 210 and 240 may have the upper surfaces formed at the same height in the third direction, and arranged in a horizontal direction substantially parallel to the upper surface of the substrate 100. However, in the region X, the first and second isolation patterns 120 and 150 covering the lower sidewalls of the first and second active fins 112 and 114, respectively, the fourth isolation pattern 210 covering the upper portion of the first sidewall of the active region 102, and the fifth isolation pattern 240 covering the lower portion of the first sidewall of the active region 102 may be formed.

Figure 20:
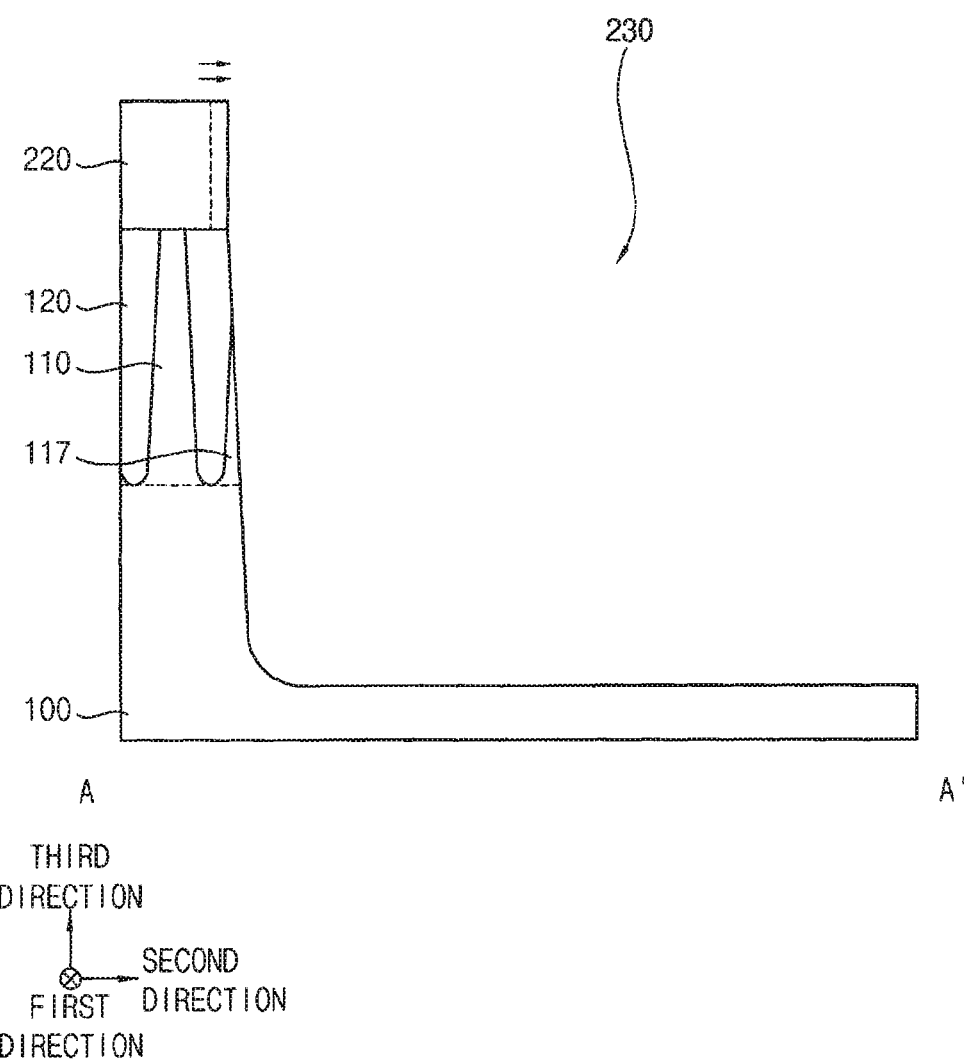
FIGS. 20 to 22 are cross-sectional views illustrating a method of manufacturing a semiconductor device in accordance with related examples.
Figure 21:
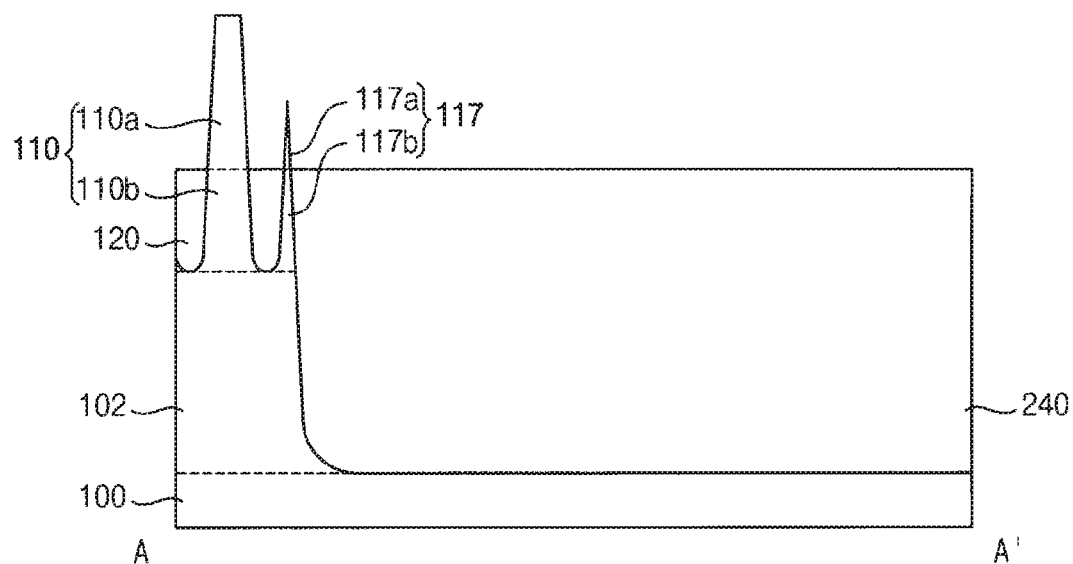
Figure 22:
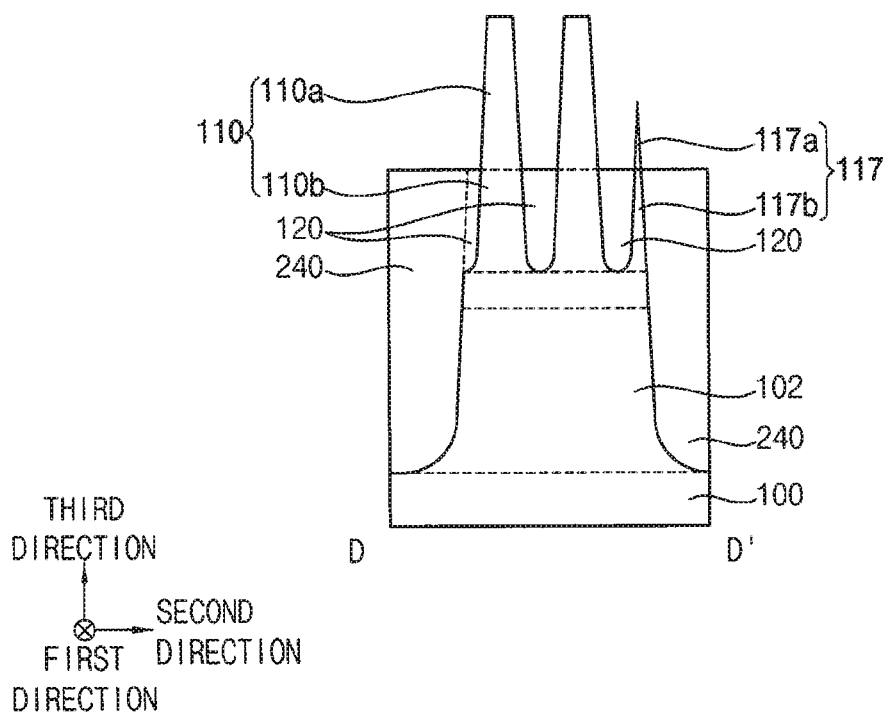

FIGS. 20 to 22 are cross-sectional views illustrating a method of manufacturing a semiconductor device in accordance with related examples.

Referring to FIG. 20, the sixth etching process may be performed immediately after the first to third etching process. Accordingly, when a misalignment occurs during the process for forming the sixth etching mask 220 used in the sixth etching process, some of the active fins 110 to be removed by the second recess 230 may not be removed and remain as a second protrusion 117. In this case, the second protrusion 117 may have an upper surface higher than that of the first protrusion 115 in the third direction.

Referring to FIGS. 21 and 22, processes substantially the same as or similar to the processes described in FIGS. 15 to 19 may be performed to complete the fabrication of the semiconductor device.

However, the second protrusion 117 may not be entirely covered by the isolation structure 250, and a portion of the second protrusion 117 may upwardly protrude. Accordingly, the second protrusion 117 may include a lower portion 117b of which a sidewall may be covered by the isolation structure 250, and an upper portion 117a upwardly protruding from the isolation structure 250 and being exposed. A source/drain layer 370 may be formed on the second protrusion 117 by a selective epitaxial growth (SEG) process that will be described with reference to FIG. 29.

Figure 23:
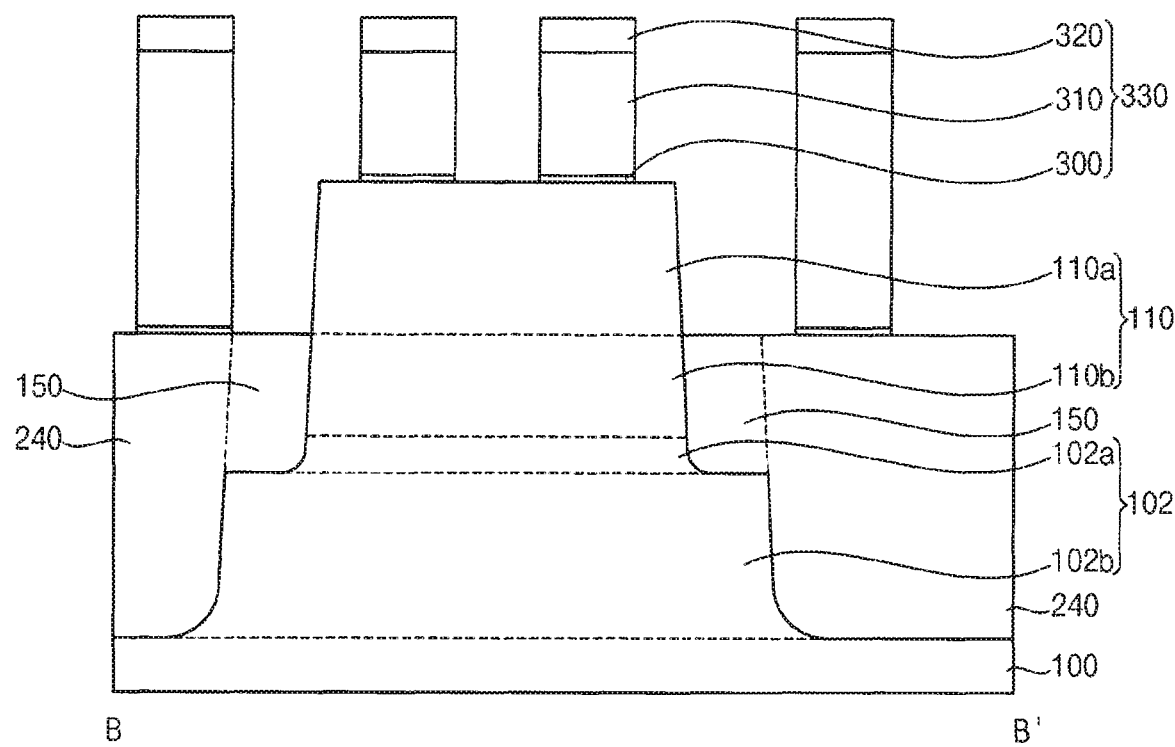

FIGS. 23 to 28 are cross-sectional views illustrating a method of manufacturing a semiconductor device in accordance with example embodiments. Specifically, FIGS. 23, 24 and 26 are cross-sectional views taken along a line B-B' of FIG. 15, and FIGS. 25, 27 and 28 are cross-sectional views taken along a line D-D' of FIG. 15.

This method of manufacturing the semiconductor device relates to a method of manufacturing a logic device by forming transistors and contact plugs on the active fins and the isolation structure formed by the processes described in FIGS. 1 to 19.

Referring to FIG. 23, a dummy gate structure 330 may be formed on the substrate 100.

Specifically, a dummy gate insulation layer, a dummy gate electrode layer and a dummy gate mask layer may be sequentially formed on the active fins 110 and the isolation structure 250, the dummy gate mask layer may be patterned to form a dummy gate mask 320, and the dummy gate electrode layer and the dummy gate insulation layer may be sequentially etched using the dummy gate mask 320 as an etching mask to form the dummy gate structure 330.

Accordingly, the dummy gate structure 330 including a dummy gate insulation pattern 300, a dummy gate electrode 310 and the dummy gate mask 320 sequentially stacked may be formed on the substrate 100. The dummy gate insulation pattern 300 may include an oxide, e.g., silicon oxide, the dummy gate electrode 310 may include, e.g., polysilicon, and the dummy gate mask 320 may include a nitride, e.g., silicon nitride.

In example embodiments, the dummy gate structure 330 may extend in the second direction, and a plurality of dummy gate structures 330 may be formed along the first direction.

Figure 25:
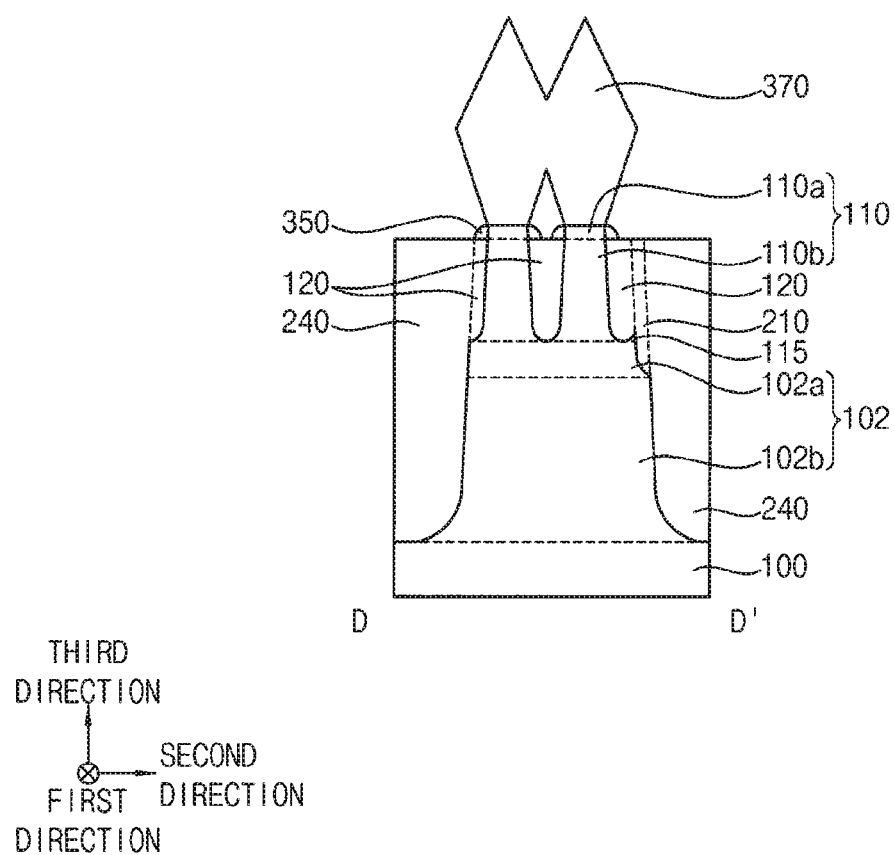

Referring to FIGS. 24 and 25, a gate spacer 340 may be formed on a sidewall of the dummy gate structure 330.

The gate spacer 340 may be formed by forming a spacer layer on the active fins 110 and the isolation structure 250 to cover the dummy gate structure 330, and anisotropically etching the spacer layer. In this case, the gate spacer 340 may be formed on the sidewall of the dummy gate structure 330, and a fin spacer 350 may be further formed on each of sidewalls of the upper active patterns 110a. The gate spacer 340 and the fin spacer 350 may include a nitride, e.g., silicon nitride.

Upper portions of the active fins 110 adjacent to the dummy gate structure 330 may be etched to form a third recess 360, and a source/drain layer 370 may be formed to fill the third recess 360.

Specifically, third recess 360 may be formed by performing a seventh etching process using the dummy gate structure 330 and the gate spacer 340 on the sidewall thereof as an etching mask to remove the upper portion of the active fins 110. When the third recess 360 may be formed, most of the fin spacer 350 adjacent to the active fins 110 may be removed, however, a lower portion of the fin spacer 350 may partially remain.

FIG. 24 illustrates that only a portion of each of the upper active patterns 110a of the active fins 110 is removed, and thus a lower surface of the third recess 360 is higher than upper surfaces of the lower active patterns 110b in the third direction, however, example embodiments are not limited thereto, and the lower surface of the third recess 360 may be equal to or lower than upper surfaces of the lower active pattern 110b.

In example embodiments, the source/drain layer 370 may be formed by performing a selective epitaxial growth (SEG) process using the upper surfaces of the active fins 110 exposed by the third recess 360.

In example embodiments, the SEG process may be performed, so that a single crystalline silicon germanium layer may be formed as the source/drain layer 370. The SEG process may be performed together with a p-type impurity source gas, and thus a single crystalline silicon germanium layer doped with p-type impurities may be formed as the source/drain layer 370. Accordingly, the source/drain layer 370 may serve as a source/drain of a PMOS transistor.

The source/drain layer 370 may expand vertically and horizontally to fill the third recess 360, and an upper portion of the source/drain layer 370 may contact a sidewall of the gate spacer 340.

In example embodiments, the source/drain layers 370 expanding on the neighboring active fins 110 in the second direction, respectively, that is, the first and second active fins 112 and 114 may be connected to be merged with each other.

Although the source/drain layer 370 serving as the source/drain of the PMOS transistor has been described above, example embodiments are not limited thereto, and the source/drain layer 370 may be formed to serve as a source/drain of an NMOS transistor.

Accordingly, a single crystalline silicon carbide layer or a single crystalline silicon layer may be formed as the source/drain layer 370. The SEG process may be performed together with an n-type impurity source gas, e.g., phosphine ($PH_3$), and thus a single crystalline silicon carbide layer doped with n-type impurities or a single crystalline silicon layer doped with n-type impurities may be formed.

Figure 27:
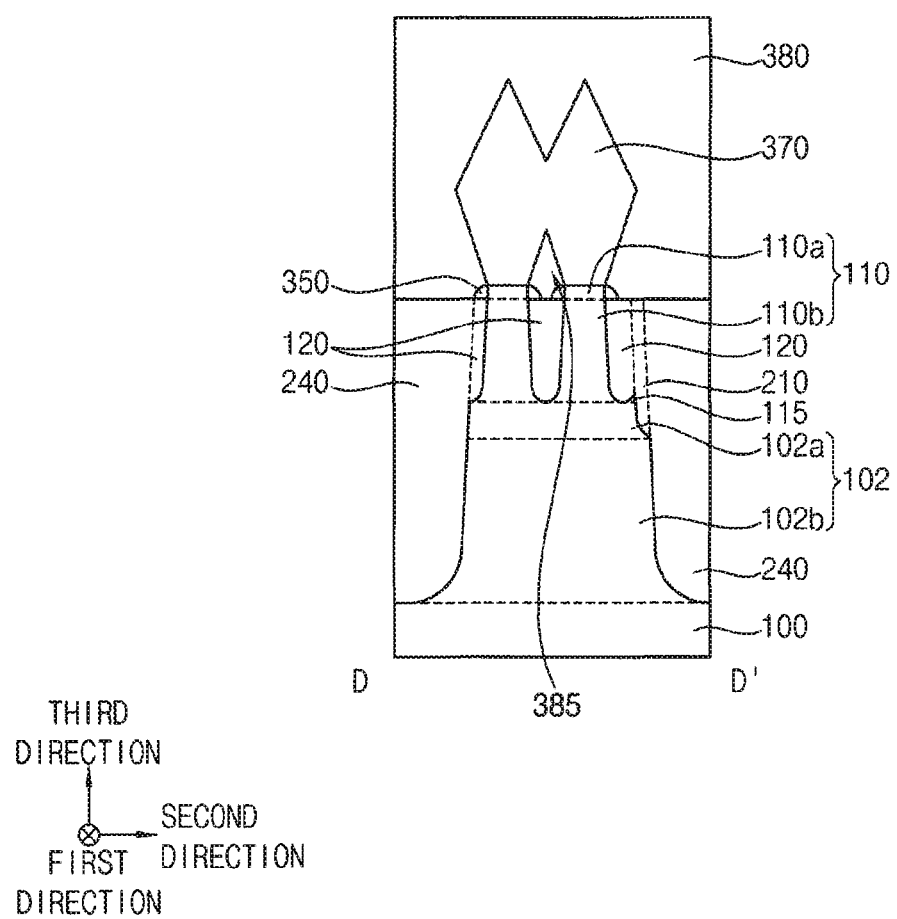

Referring to FIGS. 26 and 27, after forming a first insulating interlayer 380 on the substrate 100 to a sufficient height in the third direction to cover the dummy gate structure 330, the gate spacer 340, the source/drain layers 370 and the fin spacer 350, the first insulating interlayer 380 may be planarized until an upper surface of the dummy gate electrode 310 in the dummy gate structure 330 may be exposed.

The dummy gate mask 320 may be also removed, and an upper portion of the gate spacer 340 may be also removed. The first insulating interlayer 380 may not entirely fill a space between the merged source/drain layers 370 and the isolation structure 250, and thus an air gap 385 may be formed. The first insulating interlayer 380 may include an oxide, e.g., silicon oxide.

The exposed dummy gate electrode 310 and the dummy gate insulation pattern 300 thereunder may be removed to form a fourth opening 390 exposing an inner sidewall of the gate spacer 340 and the upper surfaces of the active fins 110, and a gate structure 440 may be formed to fill the fourth opening 390.

For example, the gate structure 440 may be formed by performing following processes.

After performing a thermal oxidation process on the upper surfaces of the active fins 110 exposed by the fourth opening 390 to form an interface pattern 400, a gate insulation layer and a work function control layer may be sequentially formed on the interface pattern 400, the isolation structure 250, the gate spacer 340 and the first insulating interlayer 380, and a gate electrode layer may be formed on the work function control layer to fill a remaining portion of the fourth opening 390.

The interface pattern 400 may also be formed by a chemical vapor deposition (CVD) process, an atomic layer deposition (ALD) process, etc., and in this case, the interface pattern 400 may be formed not only on the upper surfaces of the active fins 110, but also on the upper surface of the isolation structure 250 and the inner sidewall of the gate spacer 340.

The gate electrode layer, the work function control layer and the gate insulation layer may be planarized until an upper surface of the first insulating interlayer 380 may be exposed, a gate insulation pattern 410 and a work function control pattern 420 sequentially stacked on an upper surface of the interface pattern 400, the upper surface of the isolation structure 250, and the inner sidewall of the gate spacer 340 may be formed. Additionally, a gate electrode 430 may be formed on the work function control pattern 420 to fill the remaining portion of the fourth opening 390. Accordingly, a lower surface and a sidewall of the gate electrode 430 may be covered by the work function control pattern 420.

The interface pattern 400, the gate insulation pattern 410, the work function control pattern 420 and the gate electrode 430 sequentially stacked may form the gate structure 440, and may form a transistor together with the source/drain layers 370. The transistor may form an NMOS transistor or a PMOS transistor according to the conductive type of the source/drain layers 370.

The interface pattern 400 may include an oxide, e.g., silicon oxide, the gate insulation pattern 410 may include a metal oxide, e.g., hafnium oxide, zirconium oxide, etc., the work function control pattern 420 may include a metal nitride, e.g., titanium nitride, tantalum nitride, tungsten nitride, etc., and the gate electrode 430 may include a low resistance metal, e.g., aluminum, copper, titanium, tantalum, etc., a nitride thereof, or an alloy thereof.

An upper portion of the gate structure 440 may be removed to form a fourth recess, and a capping pattern 450 may be formed to fill the fourth recess. The capping pattern 450 may include a nitride, e.g., silicon nitride.

Figure 28:
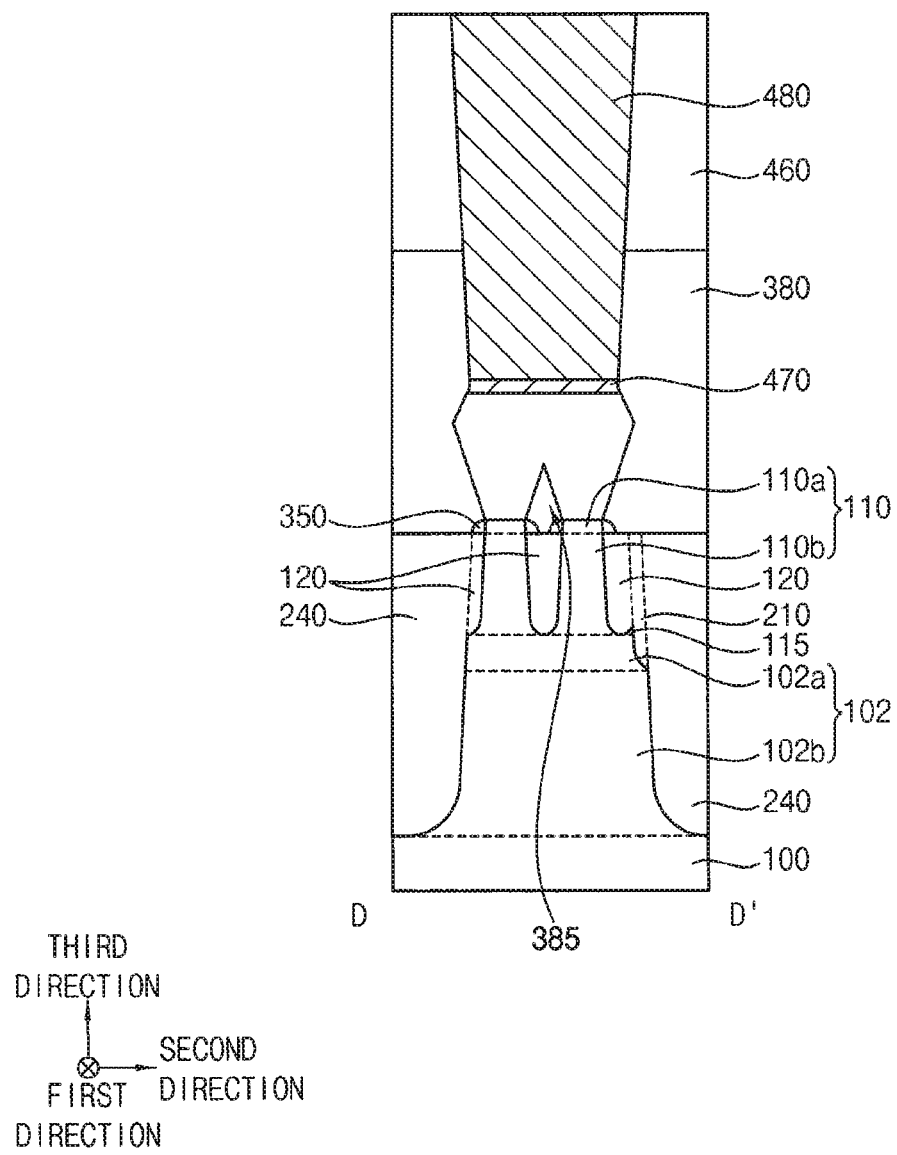

Referring to FIG. 28, a second insulating interlayer 460 may be formed on the first insulating interlayer 380, the capping pattern 450 and the gate spacer 340. A first contact plug 480 may be formed through the first and second insulating interlayers 380 and 460 to contact an upper surface of the source/drain layer 370.

For example, the first contact plug 480 may be formed by performing following processes.

A fifth opening may be formed through the first and second insulating interlayers 380 and 460 to expose the upper surface of the source/drain layer 370, a first metal layer may be formed on the exposed upper surface of the source/drain layer 370, a sidewall of the fifth opening and an upper surface of the second insulating interlayer 460, and a heat treatment process may be performed to form a metal silicide pattern 470 on the upper portion of the source/drain layer 370.

A first barrier layer may be formed on an upper surface of the metal silicide pattern 470, the sidewall of the fifth opening and the upper surface of the second insulating interlayer 460, a second metal layer may be formed on the first barrier layer to fill the fifth opening, and the second metal layer and the first barrier layer may be planarized until the upper surface of the second insulating interlayer 460 may be exposed.

Accordingly, the first contact plug 480 filling the fifth opening may be formed on the metal silicide pattern 470. The first contact plug 480 may include a first barrier pattern covering a second metal pattern and a lower surface and a sidewall thereof.

A second contact plug contacting the upper portion of the gate structure 440, and a wiring electrically connected to the first contact plug 480 and the second contact plug may be further formed to complete the fabrication of the semiconductor device.

As described above, all of the active fins 110 to be removed may be more efficiently removed, so that only the desired active fins 110 may be formed on the active region 102, and the source/drain layer 370 may be formed only on the desired active fins 110. The source/drain layer 370 may not be formed on the remaining first protrusion 115 among the active fins 110, so that an electrical short with, e.g., the neighboring gate structure 440 may be reduced or prevented.

Figure 29:
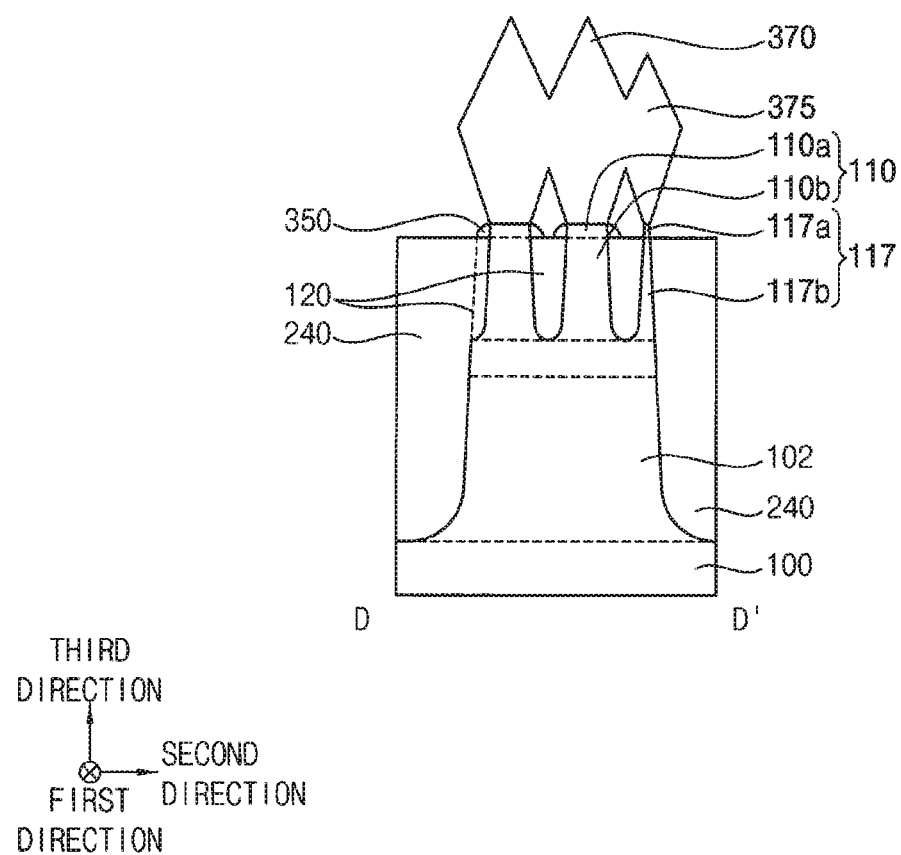
FIGS. 29 and 30 are cross-sectional views illustrating a method of manufacturing a semiconductor device in accordance with related examples.
Figure 30:
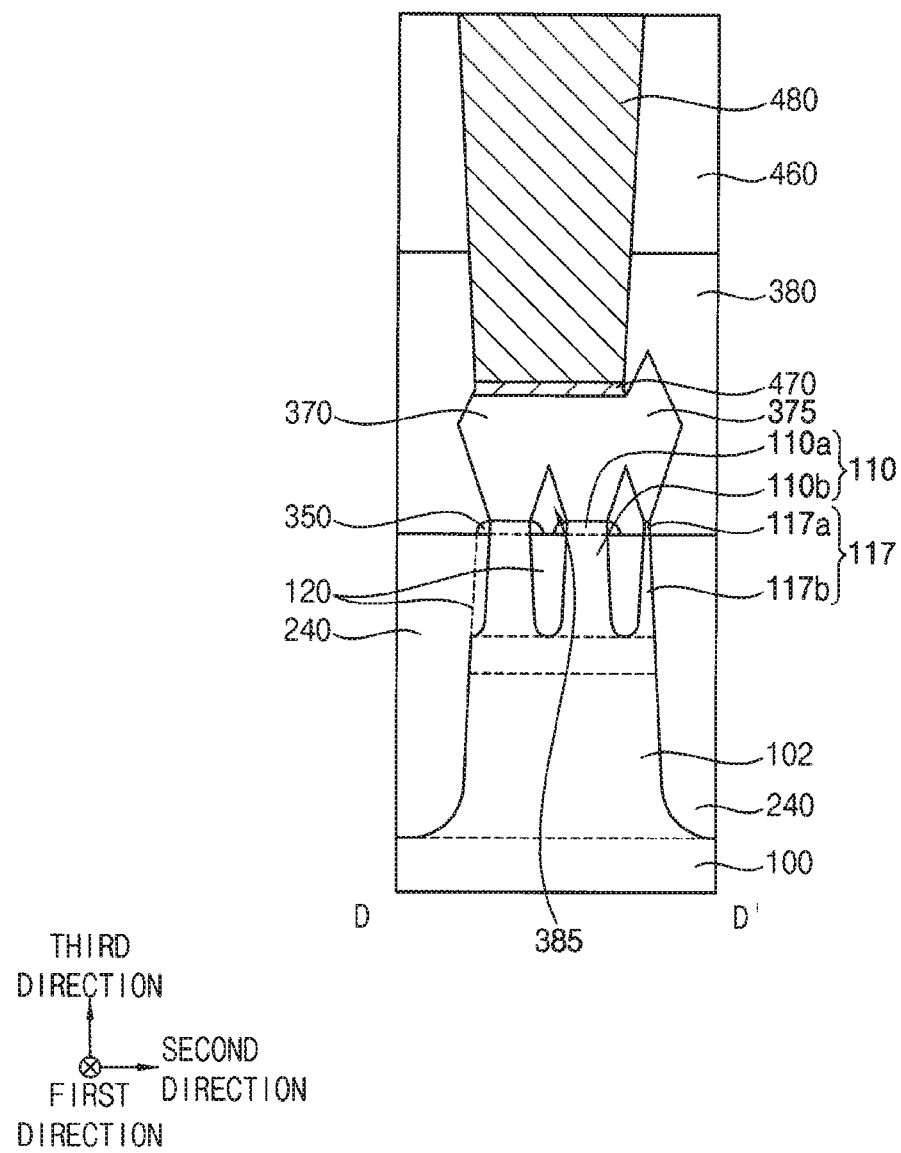

FIGS. 29 and 30 are cross-sectional views illustrating a method of manufacturing a semiconductor device in accordance with related examples. Specifically, FIGS. 29 and 30 are cross-sectional views taken along a line D-D' of FIG. 15.

Referring to FIG. 29, processes substantially the same as or similar to the processes described in FIGS. 23 to 25 may be performed.

However, the second protrusion 117 neighboring with the active fins 110 may include an upper portion 117a upwardly protruding from the isolation structure 250. Accordingly, a parasitic source/drain layer 375 may be formed not only on the upper portions of the active fins 110 but also on an upper portion of the second protrusion 117, and may be merged with the source/drain layer 370 adjacent thereto.

Referring to FIG. 30, processes substantially the same as or similar to the processes described in FIGS. 26 to 28 may be performed to complete the fabrication of the semiconductor device.

The first contact plug 480 on the source/drain layer 370 may be electrically connected to the parasitic source/drain layer 375 merged with the source/drain layer 370, and thus an electrical short may occur due to undesired current paths.

The above semiconductor devices may be applied to various types of memory devices and systems including finFETs. For example, the semiconductor may be applied to logic devices such as central processing units (CPUs), main processing units (MPUs), or application processors (APs), or the like, including finFETs. Additionally, the semiconductor device may be applied to volatile memory devices such as SRAM devices or DRAM devices, or the like, or non-volatile memory devices such as flash memory devices, PRAM devices, MRAM devices, RRAM devices, or the like, including finFETs.

While example embodiments have been described with reference to the figures, it will be understood by those of ordinary skill in the art that various changes in form and details may be made therein without departing from the spirit and scope as defined by the following claims.

What is claimed is:

1. A semiconductor device, comprising:
   a substrate;
   an active region upwardly protruding from the substrate, the active region comprising an upper portion and a lower portion;
   a plurality of active fins upwardly protruding from the active region and extending in a first direction parallel to an upper surface of the substrate, the plurality of active fins being provided in a second direction that is parallel to the upper surface of the substrate and intersects with the first direction; and
   an isolation structure provided on the substrate, the isolation structure covering a first sidewall of the active region and a lower portion of a sidewall of each of the plurality of active fins,
   wherein the first sidewall of the active region is provided adjacent to a first active fin among the plurality of active fins, the first active fin being provided on a first edge of the active region in the second direction,
   wherein the first sidewall of the active region comprises a sidewall of the upper portion of the active region and a sidewall of the lower portion of the active region, and
   wherein the sidewall of the upper portion of the active region, an upper surface of the upper portion of the active region, and the sidewall of the first active fin form a staircase shape.

2. The semiconductor device of claim 1,
wherein a first distance from the sidewall of the upper portion of the active region to the sidewall of the first active fin in the second direction is smaller than a second distance from the sidewall of the lower portion of the active region to the sidewall of the first active fin in the second direction, the first distance and the second distance being greater than zero.

3. The semiconductor device of claim 1, wherein a second sidewall of the active region adjacent to a second active fin among the plurality of active fins has a constant slope with respect to the upper surface of the substrate, the second active fin being provided on a second edge of the active region opposite to the first edge in the second direction.

4. The semiconductor device of claim 1, further comprising:
a protrusion provided between the first active fin and the first sidewall of the active region.

5. The semiconductor device of claim 4, wherein an upper surface of the protrusion is lower than an upper surface of the isolation structure.

6. The semiconductor device of claim 3, wherein the sidewall of the second active fin directly contacts the second sidewall of the active region.

7. The semiconductor device of claim 3, wherein the isolation structure comprises a first isolation pattern, a second isolation pattern, and a third isolation pattern provided in the second direction.

8. The semiconductor device of claim 7, wherein an upper surface of the first isolation pattern, and an upper surface of the second isolation pattern, and an upper surface of the third isolation pattern are provided at a same height.

9. The semiconductor device of claim 7, wherein the first isolation pattern covers the lower portion of the sidewall of each of the plurality of active fins, the second isolation pattern covers an upper portion of the second sidewall of the active region, and the third isolation pattern covers a lower portion of the second sidewall of the active region.

10. The semiconductor device of claim 1, wherein two active fins among the plurality of active fins are provided on the active region.

11. The semiconductor device of claim 1, further comprising:
a gate structure provided on the plurality of active fins and the isolation structure, respectively, the gate structure extending in the second direction;
a source/drain layer provided on the plurality of active fins adjacent to the gate structure; and
a protrusion provided between the first active fin and the first sidewall of the active region.

12. The semiconductor device of claim 11,
wherein the source/drain layer is not provided on the protrusion.

13. A semiconductor device, comprising:
a substrate;
an active region upwardly protruding from the substrate, the active region comprises:
a lower portion having a first width in a second direction parallel to an upper surface of the substrate; and
an upper portion provided on the lower portion, the upper portion having a second width smaller than the first width in the second direction;
an active fin upwardly protruding from the active region and extending in a first direction, the first direction being parallel to the upper surface of the substrate and intersecting with the second direction;
an isolation structure provided on the substrate, the isolation structure covering a first sidewall of the active region and a lower portion of a sidewall of the active fin; and
a protrusion provided between the active fin and the first sidewall of the active region.

14. The semiconductor device of claim 13, wherein the first sidewall of the active region in the second direction is bent at a boundary between the upper portion of the active region and the lower portion of the active region.

15. The semiconductor device of claim 14, wherein a second sidewall of the active region opposite to the first sidewall in the second direction is flat at the boundary between the upper portion of the active region and the lower portion of the active region.

16. The semiconductor device of claim 14,
wherein a height of an upper surface of the protrusion is lower than a height of an upper surface of the isolation structure.

17. The semiconductor device of claim 13, further comprising a plurality of active fins provided in the second direction on the active region, the plurality of active fins comprises the active fin.

18. A semiconductor device, comprising:
a substrate;
an active region upwardly protruding from the substrate, the active region comprising an upper portion and a lower portion;
a plurality of active fins upwardly protruding from the active region and extending in a first direction parallel to an upper surface of the substrate, the plurality of active fins being provided in a second direction that is parallel to the upper surface of the substrate and intersects with the first direction;
an isolation structure provided on the substrate, the isolation structure covering a first sidewall of the active region and a lower portion of a sidewall of each of the plurality of active fins;
a gate structure provided on the plurality of active fins and the isolation structure, respectively, the gate structure extending in the second direction; and
a source/drain layer provided on the plurality of active fins adjacent to the gate structure,
wherein the first sidewall of the active region is provided adjacent to a first active fin among the plurality of active fins, the first active fin being provided on a first edge of the active region in the second direction,
wherein the first sidewall of the active region comprises a sidewall of the upper portion of the active region and a sidewall of the lower portion of the active region, and
wherein the sidewall of the upper portion of the active region, an upper surface of the upper portion of the active region, and the sidewall of the first active fin form a staircase shape.

19. The semiconductor device of claim 18, further comprising:
a protrusion provided between the first active fin and the first sidewall of the active region,
wherein a height of an upper surface of the protrusion is lower than a height of an upper surface of the isolation structure.

20. The semiconductor device of claim 19, wherein the source/drain layer is not provided on the protrusion.

* * * * *